United States Patent
Kumagai et al.

(10) Patent No.: US 12,071,859 B2
(45) Date of Patent: Aug. 27, 2024

(54) ASSEMBLY METHOD FOR TURBINE, ASSEMBLY SUPPORT PROGRAM FOR TURBINE, AND ASSEMBLY SUPPORT DEVICE FOR TURBINE

(71) Applicant: MITSUBISHI HEAVY INDUSTRIES, LTD., Tokyo (JP)

(72) Inventors: Satoshi Kumagai, Tokyo (JP); Shunsuke Mizumi, Tokyo (JP); Koji Ishibashi, Yokohama (JP); Juichi Kodera, Yokohama (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 17/908,111

(22) PCT Filed: Dec. 4, 2020

(86) PCT No.: PCT/JP2020/045289
§ 371 (c)(1),
(2) Date: Aug. 30, 2022

(87) PCT Pub. No.: WO2022/044354
PCT Pub. Date: Mar. 3, 2022

(65) Prior Publication Data
US 2023/0097598 A1    Mar. 30, 2023

(30) Foreign Application Priority Data

Aug. 25, 2020  (JP) ................. 2020-141415

(51) Int. Cl.
*F01D 25/24*  (2006.01)
*G01B 11/24*  (2006.01)
*G06F 30/17*  (2020.01)

(52) U.S. Cl.
CPC .............. *F01D 25/24* (2013.01); *G01B 11/24* (2013.01); *G06F 30/17* (2020.01); *F05D 2230/60* (2013.01); *F05D 2260/81* (2013.01)

(58) Field of Classification Search
CPC ....... B21C 37/121; B21C 37/123; F16L 11/16
See application file for complete search history.

(56) References Cited

U.S. PATENT DOCUMENTS

| 5,627,761 A | * | 5/1997 | Pollard | .................... G01B 7/14 324/207.22 |
| 6,257,829 B1 | * | 7/2001 | Seeley | .................... F01D 25/00 415/213.1 |

(Continued)

FOREIGN PATENT DOCUMENTS

| CN | 109630215 A | 4/2019 |
| JP | H05-86807 A | 4/1993 |

(Continued)

OTHER PUBLICATIONS

International Search Report dated Jan. 19, 2021, issued in counterpart application No. PCT/JP2020/045289 with English translation. (4 pages).

*Primary Examiner* — Lawrence Averick
(74) *Attorney, Agent, or Firm* — WHDA, LLP

(57) ABSTRACT

In an assembly method for a turbine, measured shape data is acquired by measuring a shape for each of a plurality of casing components in a state in which the plurality of casing components are not fastened to each other. self-weighted state shape data, which is shape data when self-weight is applied, is created for each of the plurality of casing components. A reference shape model is corrected based on a difference between the measured shape data of a target measurement part and the self-weighted state shape data of the target measurement part. By using the corrected shape model, fastened state shape data, which is shape data in a (Continued)

state in which the plurality of casing components are fastened to each other, is estimated for each of the plurality of casing components.

7 Claims, 15 Drawing Sheets

(56) References Cited

U.S. PATENT DOCUMENTS

| | | | |
|---|---|---|---|
| 8,982,320 B2* | 3/2015 | Okita | G03F 9/7046 |
| | | | 355/72 |
| 10,339,264 B2* | 7/2019 | Burkett | G06F 30/17 |
| 2008/0106714 A1* | 5/2008 | Okita | G03F 9/7092 |
| | | | 355/53 |
| 2016/0025067 A1 | 1/2016 | Pristash | |
| 2017/0206303 A1* | 7/2017 | Burkett | G06F 30/17 |
| 2018/0307205 A1 | 10/2018 | Yashirodai et al. | |
| 2019/0107007 A1 | 4/2019 | Yashirodai et al. | |
| 2019/0292926 A1 | 9/2019 | Murata et al. | |

FOREIGN PATENT DOCUMENTS

| | | |
|---|---|---|
| JP | 2004-185252 A | 7/2004 |
| JP | 2018-178960 A | 11/2018 |
| JP | 2019-070334 A | 5/2019 |
| TW | 201827697 A | 8/2018 |

\* cited by examiner

ASSEMBLY METHOD FOR TURBINE, ASSEMBLY SUPPORT PROGRAM FOR TURBINE, AND ASSEMBLY SUPPORT DEVICE FOR TURBINE

TECHNICAL FIELD

The present disclosure relates to an assembly method for a turbine, an assembly support program for a turbine, and an assembly support device for a turbine.

This application claims priority based on Japanese Patent Application No. 2020-141415 filed in Japan on Aug. 25, 2020, the contents of which are incorporated herein by reference.

BACKGROUND ART

A steam turbine generally includes a rotor that rotates about an axis, a casing that covers an outer periphery of the rotor, and a plurality of diaphragms aligned in an axial direction. The rotor includes a rotor shaft extending in the axial direction, and a plurality of rotor blade rows mounted on the rotor shaft along the axial direction. Each of the plurality of rotor blade rows includes a plurality of rotor blades aligned in a circumferential direction with respect to the axis. The casing includes an inner casing that covers an outer periphery side of the rotor and an outer casing that covers an outer periphery side of the inner casing.

The outer casing includes a lower half outer casing that constitutes a portion below the axis, and an upper half outer casing that constitutes a portion above the axis. The upper half outer casing is fastened to the lower half outer casing with bolts. Further, the inner casing includes a lower half inner casing that constitutes a portion below the axis and an upper half inner casing that constitutes a portion above the axis. The upper half inner casing is fastened to the lower half inner casing with bolts. The lower half inner casing is supported by the lower half outer casing. The diaphragm includes a lower half diaphragm that constitutes a portion below the axis and an upper half diaphragm that constitutes a portion above the axis. Each of the lower half diaphragm and the upper half diaphragm includes a plurality of stator vanes aligned in the circumferential direction, a diaphragm inner ring that connects portions of the plurality of stator vanes at the radial inner side to each other, and a diaphragm outer ring that connects portions of the plurality of stator vanes at the radial outer side to each other. The lower half diaphragm is mounted on an inner peripheral side of the lower half inner casing, and the upper half diaphragm is mounted on an inner peripheral side of the upper half inner casing.

The steam turbine is disassembled and reassembled every time inspection or the like is performed. In the assembly of the steam turbine after disassembly, for example, a method disclosed as existing technology in Patent Document 1 below is performed. Note that when the disassembly of the steam turbine is complete, the upper half outer casing is removed from the lower half outer casing, the upper half inner casing is removed from the lower half inner casing, the rotor is placed outside of the casing, and the plurality of diaphragms are removed from the inner casing. Each diaphragm is separated into the lower half diaphragm and the upper half diaphragm.

First, primary temporary assembly is performed. In the primary temporary assembly, the diaphragm is temporarily assembled by assembling the upper half diaphragm to the lower half diaphragm. Subsequently, the temporarily assembled diaphragm is attached to the lower half inner casing placed inside the lower half outer casing. Subsequently, the inner casing is temporarily assembled by bolting the upper half inner casing to the lower inner half casing. The above procedure completes the primary temporary assembly. Note that in the primary temporarily assembled state, the rotor is not placed in the inner casing.

Subsequently, in the primary temporarily assembled state, a piano wire is stretched on an axis that is determined relative to the outer casing and the inner casing, and the distance between the piano wire and the diaphragm is measured. In other words, here, the distance between a virtual rotor and the diaphragm is measured in the primary temporarily assembled state.

Subsequently, the upper half outer casing is removed from the lower half outer casing, and the upper half inner casing is removed from the lower half inner casing.

Subsequently, the distance between the piano wire and the diaphragm is measured again. In other words, the distance between the virtual rotor and the diaphragm is measured in a state in which the upper half outer casing is removed from the lower half outer casing, and the upper half inner casing is removed from the lower half inner casing. Then, the distance displacement amount and the like between the virtual rotor and the diaphragm are calculated when a state in which the upper half outer casing is removed from the lower half outer casing and the upper half inner casing is removed from the lower half inner casing shifts to a state in which the upper half outer casing is fastened to the lower half outer casing and the upper half inner casing is fastened to the lower half inner casing.

Next, secondary temporary assembly is performed. In the secondary temporary assembly, first, the lower half diaphragm is attached to the lower half inner casing placed inside the lower half outer casing. Subsequently, the rotor is placed on the lower half outer casing and the lower half inner casing via bearings. Subsequently, the upper half diaphragm is attached to the lower half diaphragm. Subsequently, the upper half inner casing is bolted to the lower half inner casing. Then, the upper half outer casing is bolted to the lower half outer casing. In each step in the secondary temporary assembly, shims or the like are placed between the inner casing and the diaphragm or at a portion of the outer casing that supports the inner casing, in consideration of the previously calculated distance displacement amount and the like between the virtual rotor and the diaphragm, to adjust the relative position between the rotating body and the stationary body so that the gaps between the rotor, which is the rotating body, and the inner casing, the diaphragm, and the like, which constitute the stationary body, are within allowable ranges. Further, in each step in the secondary temporary assembly, a lead member is placed between the rotating body and a stationary body, at a position where a seal is placed. At the end of the secondary temporary assembly step, the lead member is sandwiched and crushed between the rotating body and the stationary body.

Next, the secondary temporarily assembled steam turbine is disassembled. In the disassembly step, the lead member placed inside the steam turbine in the secondary temporary assembly step is collected, and the thickness of the lead member is measured. Then, the height of the seal (dimension in the radial direction to the axis) is determined based on this thickness.

Next, the main assembly is performed. In the main assembly, a height-adjusted sealing device is mounted on the stationary body or the like to adjust a minute gap between a tip of the sealing device and the rotating body.

As described above, in the method disclosed as existing technology in Patent Document 1 below, two temporary assemblies are required before the main assembly, and this involves a great deal of labor when assembling the steam turbine.

Thus, the embodiment of Patent Document 1 and Patent Document 2 disclose methods for omitting the primary temporary assembly. In these methods, the deformation of each of the casings is simulated when a state in which the upper half outer casing is removed from the lower half outer casing and the upper half inner casing is removed from the lower half inner casing shifts to a state in which the upper half outer casing is fastened to the lower half outer casing and the upper half inner casing is fastened to the lower half inner casing. Next, based on a result of the simulation, the distance between the rotating body and the stationary body (gap between these components) in a state in which the upper half outer casing is fastened to the lower half outer casing and the upper half inner casing is fastened to the lower half inner casing is determined. In the methods disclosed in Patent Documents 1 and 2, based on this distance, shims or the like are placed between the inner casing and the diaphragm or at a portion of the outer casing that supports the inner casing to adjust the relative position between the rotating body and the stationary body so that the gaps between the rotor, which is the rotating body, and the inner casing, the diaphragm, and the like, which constitute the stationary body, are within allowable ranges. In other words, in the embodiment of Patent Document 1 and the technology described in Patent Document 2, the primary temporary assembly is omitted by simulating the deformation of the casing.

CITATION LIST

Patent Document

Patent Document 1: JP 2018-178960 A (FIG. 5)
Patent Document 2: JP 2019-070334 A

SUMMARY OF INVENTION

Technical Problem

In the embodiment of Patent Document 1 and the technology described in Patent Document 2, the labor for assembling the steam turbine can be reduced by reducing the number of temporary assemblies. In the assembly of the steam turbine, from the perspective of increasing efficiency and other factors of the steam turbine, the relative position of the stationary body to the rotating body is required to be within an allowable range with high accuracy.

Thus, an object of the present disclosure is to provide a technology with which a relative position of a stationary body to a rotating body can be within an allowable range with high accuracy.

Solution to Problem

An assembly method for a turbine as one aspect for achieving the purpose, the turbine including a rotating body rotatable about an axis and a stationary body including a casing covering an outer periphery of the rotating body, in which the casing includes a plurality of casing components aligned in a circumferential direction with respect to the axis and a plurality of bolts configured to fasten the plurality of casing components to each other, the assembly method includes creating a reference shape model for each of a plurality of stationary body components constituting the stationary body based on reference shape data for each of the plurality of stationary body components obtained before the turbine is shipped from a plant, acquiring measured shape data for each of the plurality of casing components by measuring a shape of a target measurement part that is predetermined for each of the plurality of casing components, in an open state in which the plurality of casing components are not fastened to each other with the plurality of bolts after the turbine is disassembled, creating self-weighted state shape data that is shape data when self-weight is applied to each of the plurality of casing components by using the reference shape model for each of the plurality of casing components, for each of the plurality of casing components, computing a model correction amount of the reference shape model from a difference between the measured shape data of the target measurement part and the self-weighted state shape data of the target measurement part, for each of the plurality of casing components, creating a corrected shape model by correcting the reference shape model for each of the plurality of casing components by using the model correction amount for each of the plurality of casing components, estimating, by using the corrected shape model, fastened state shape data that is shape data of each of the plurality of casing components in a state in which the plurality of casing components are fastened to each other, calculating, by using the fastened state shape data for each of the plurality of casing components, an interval of a predetermined portion among intervals between the stationary body and the rotating body in a state in which the plurality of casing components are fastened to each other and the plurality of stationary body components and the rotating body are assembled to each other, and assembling the plurality of stationary body components and the rotating body to each other. The self-weighted state shape data is shape data when self-weight is applied to the casing component in the same orientation as an orientation of the casing component when the shape of the target measurement part is actually measured. The assembling includes adjusting the interval of the predetermined portion calculated in the calculating an interval to be within a predetermined allowable range.

An assembly support program for a turbine as another aspect for achieving the purpose, the turbine including a rotating body rotatable about an axis and a stationary body including a casing covering an outer periphery of the rotating body, in which the casing includes a plurality of casing components aligned in a circumferential direction with respect to the axis and a plurality of bolts configured to fasten the plurality of casing components to each other, the program causing a computer to execute a reference shape model creation step of creating a reference shape model for each of a plurality of stationary body components constituting the stationary body based on reference shape data for each of the plurality of stationary body components obtained before the turbine is shipped from a plant, a measured shape data acquisition step of acquiring measured shape data for each of the plurality of casing components based on a result of measuring a shape of a target measurement part that is predetermined for each of the plurality of casing components, in an open state in which the plurality of casing components are not fastened to each other with the plurality of bolts after the turbine is disassembled, a self-weighted state shape data creation step of creating self-weighted state shape data that is shape data when self-weight is applied to each of the plurality of casing components by using the reference shape model for each of the plurality of casing components, for each of the plurality of casing components, a model correction amount computation step of computing a model correction amount of the reference shape model from a difference between the measured shape data of the target measurement part and the self-weighted state shape data of the target measurement part, for each of the plurality of casing components, a corrected shape model creation step of creating a corrected shape model by correcting the reference shape model for each of the plurality of casing components by using the model correction amount for each of the plurality of casing components, and an interval calculation step of calculating, by using fastened state shape data for each of the plurality of casing component, an interval of a predetermined portion among intervals between the stationary body and the rotating body in a state in which the plurality of casing components are fastened to each other and the plurality of stationary body components and the rotating body are assembled to each other. The self-weighted state shape data is shape data when self-weight is applied to the casing component in the same orientation as an orientation of the casing component when the shape of the target measurement part is actually measured. The fastened state shape data for each of the plurality of casing components is shape data estimated, by using the corrected shape model, for each of the plurality of casing components in a state in which the plurality of casing components are fastened to each other.

An assembly support device for a turbine as still another aspect for achieving the purpose, the turbine including a rotating body rotatable about an axis and a stationary body including a casing covering an outer periphery of the rotating body, in which the casing includes a plurality of casing components aligned in a circumferential direction with respect to the axis and a plurality of bolts configured to fasten the plurality of casing components to each other, the assembly support device includes a reference shape model creation unit configured to create a reference shape model for each of a plurality of stationary body components constituting the stationary body based on reference shape data for each of the plurality of stationary body components obtained before the turbine is shipped from a plant, a measured shape data acquisition unit configured to acquire measured shape data for each of the plurality of casing components based on a result of measuring a shape of a target measurement part that is predetermined for each of the plurality of casing components, in an open state in which the plurality of casing components are not fastened to each other with the plurality of bolts after the turbine is disassembled, a self-weighted state shape data creation unit configured to create self-weighted state shape data that is shape data when self-weight is applied to each of the plurality of casing components by using the reference shape model, for each of the plurality of casing components for each of the plurality of casing components, a model correction amount computation unit configured to compute a model correction amount of the reference shape model from a difference between the measured shape data of the target measurement part and the self-weighted state shape data of the target measurement part, for each of the plurality of casing components, a corrected shape model creation unit configured to create a corrected shape model by correcting the reference shape model for each of the plurality of casing components by using the model correction amount for each of the plurality of casing components, and an interval calculation unit configured to calculate, by using fastened state shape data for each of the plurality of casing components, an interval of a predetermined portion among intervals between the stationary body and the rotating body in a state in which the plurality of casing components are fastened to each other and the plurality of stationary body components and the rotating body are assembled to each other. The self-weighted state shape data is shape data when self-weight is applied to the casing component in the same orientation as an orientation of the casing component when the shape of the target measurement part is actually measured. The fastened state shape data for each of the plurality of casing components is shape data estimated, by using the corrected shape model, for each of the plurality of casing components in a state in which the plurality of casing components are fastened to each other.

Advantageous Effects of Invention

In the one aspect of the present disclosure, the relative position of the stationary body to the rotating body can be within an allowable range with high accuracy.

DESCRIPTION OF EMBODIMENTS

Hereinafter, embodiments of an assembly method for a turbine, an assembly support program used in the assembly method, and an assembly support device that supports the assembly method according to the present disclosure will be described.

Embodiment of Steam Turbine

A steam turbine according to the present embodiment will be described with reference to FIGS. 1 to 5.

Figure 1:
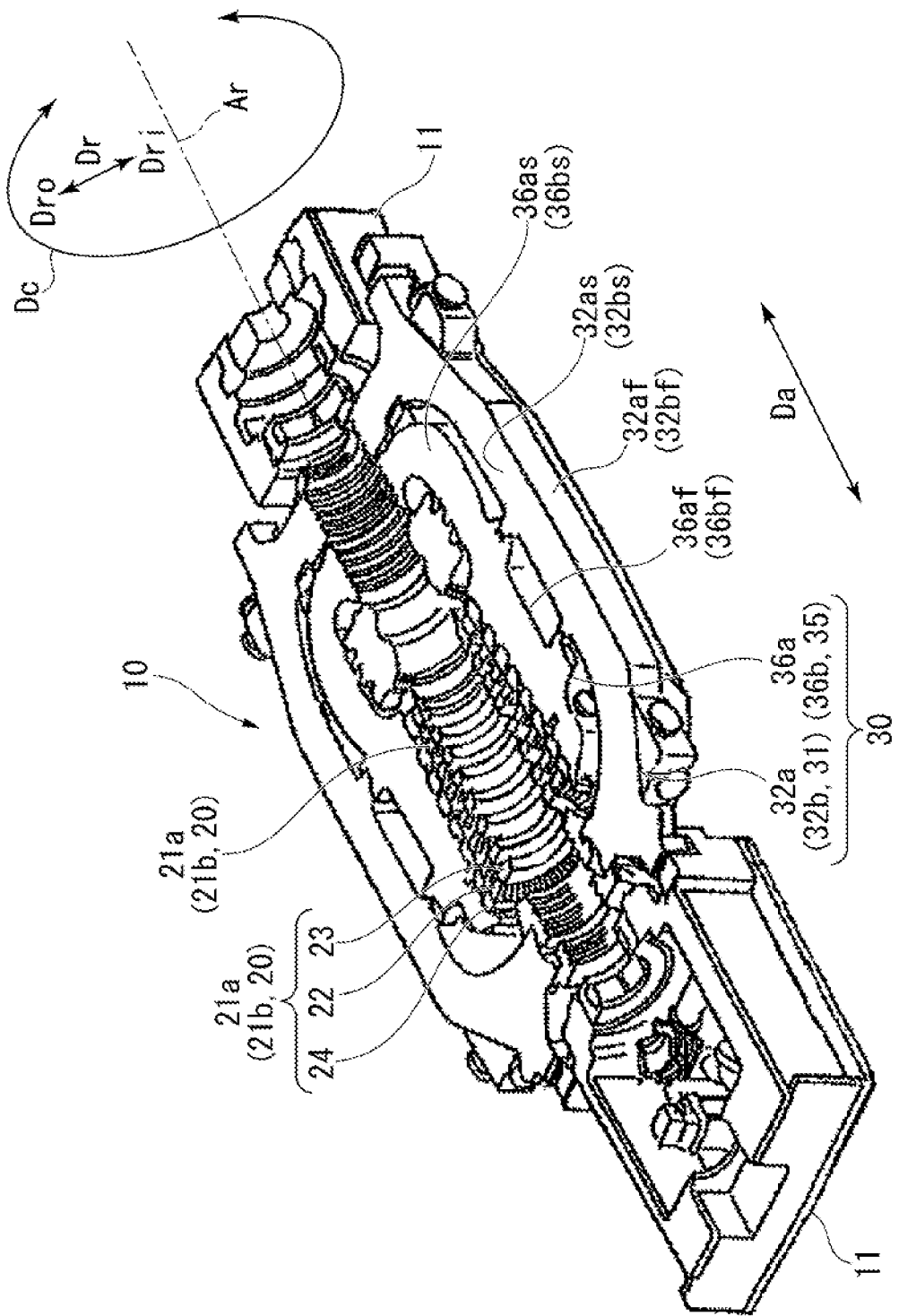
FIG. 1 is a perspective view illustrating a steam turbine in a state in which a rotor, an upper half outer casing, and an upper half inner casing are removed in an embodiment according to the present disclosure.
Figure 2:
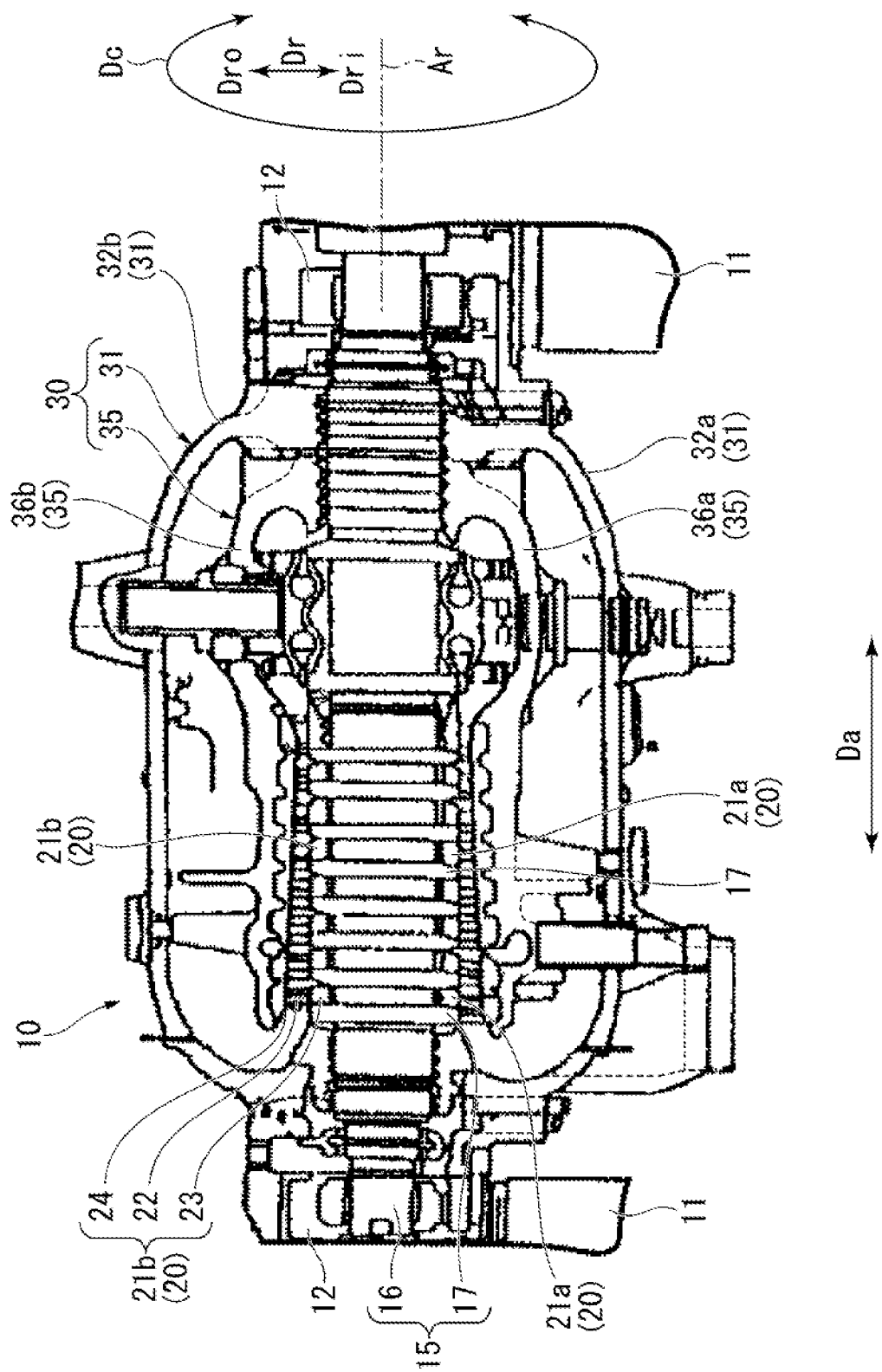
FIG. 2 is a cross-sectional view illustrating the steam turbine in the embodiment according to the present disclosure.

As illustrated in FIGS. 1 and 2, a steam turbine 10 according to the present embodiment includes a rotor 15 that rotates about an axis Ar, a plurality of diaphragms 20, a casing 30 that covers an outer peripheral side of the rotor 15 and houses the plurality of diaphragms 20, bearings 12 (see FIG. 2) that rotatably support the rotor 15, and frames 11 that support the casing 30. Note that the rotor 15 is a rotating body of the steam turbine 10. In addition, the casing 30 and the diaphragm 20 are stationary bodies of the steam turbine 10.

Here, a direction in which the axis Ar extends is referred to as an axial direction Da, a circumferential direction with respect to the axis Ar is simply referred to as a circumferential direction Dc, and a radial direction with respect to the axis Ar is simply referred to as a radial direction Dr. Further, in the radial direction Dr, a side closer to the axis Ar is referred to as a radial inner side Dri, and a side far from the axis Ar is referred to as a radial outer side Dro.

The rotor 15 includes a rotor shaft 16 extending in the axial direction Da, and a plurality of rotor blade rows 17 mounted on the rotor shaft 16 along the axial direction Da. Each of the plurality of rotor blade rows 17 includes a plurality of rotor blades aligned in the circumferential direction Dc with respect to the axis Ar. Both end portions of the rotor shaft 16 are rotatably supported by the bearings 12 mounted on the frames 11.

As illustrated in FIGS. 2 to 5, the casing 30 includes an inner casing 35 that covers an outer peripheral side of the rotor 15 and an outer casing 31 that covers an outer peripheral side of the inner casing 35.

Figure 3:
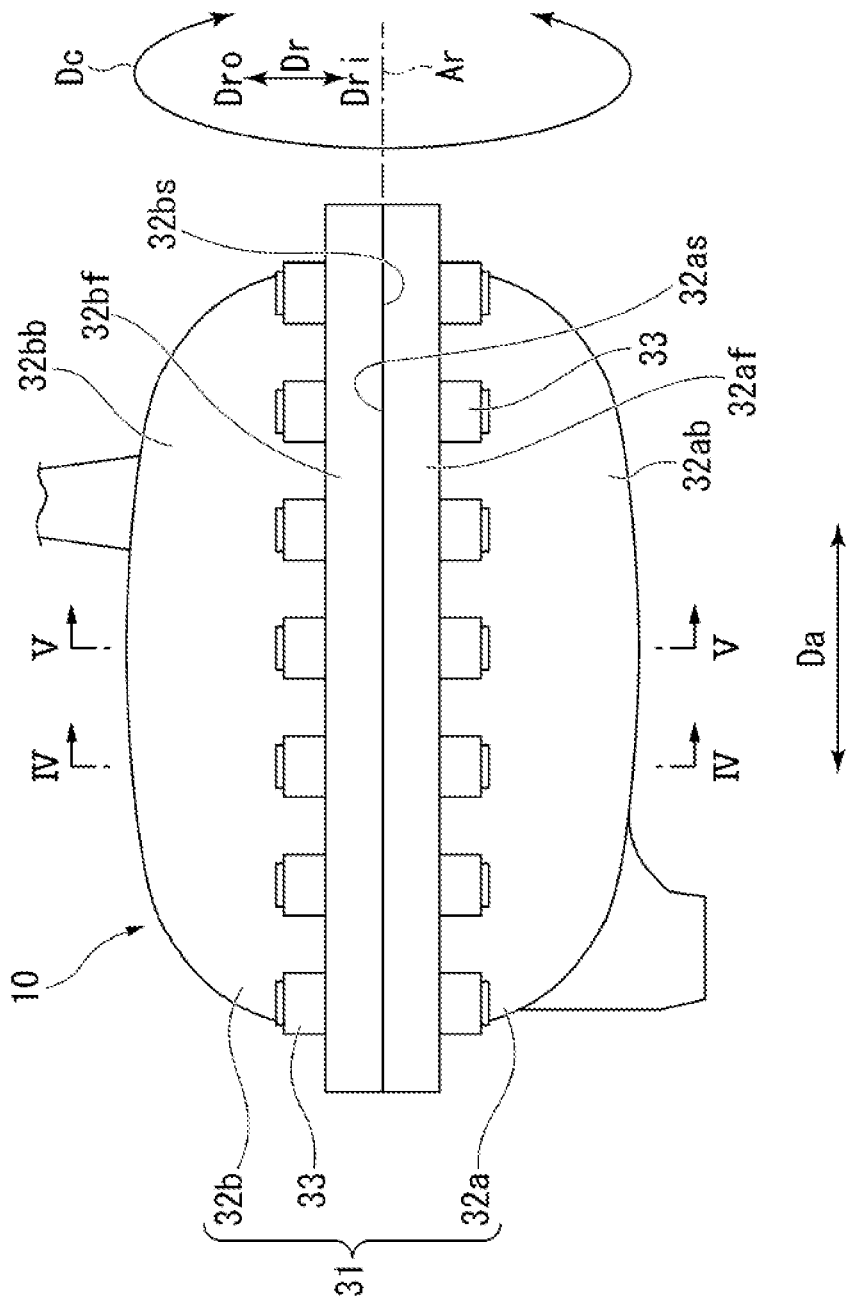
FIG. 3 is a side view illustrating the steam turbine in the embodiment according to the present disclosure.
Figure 4:
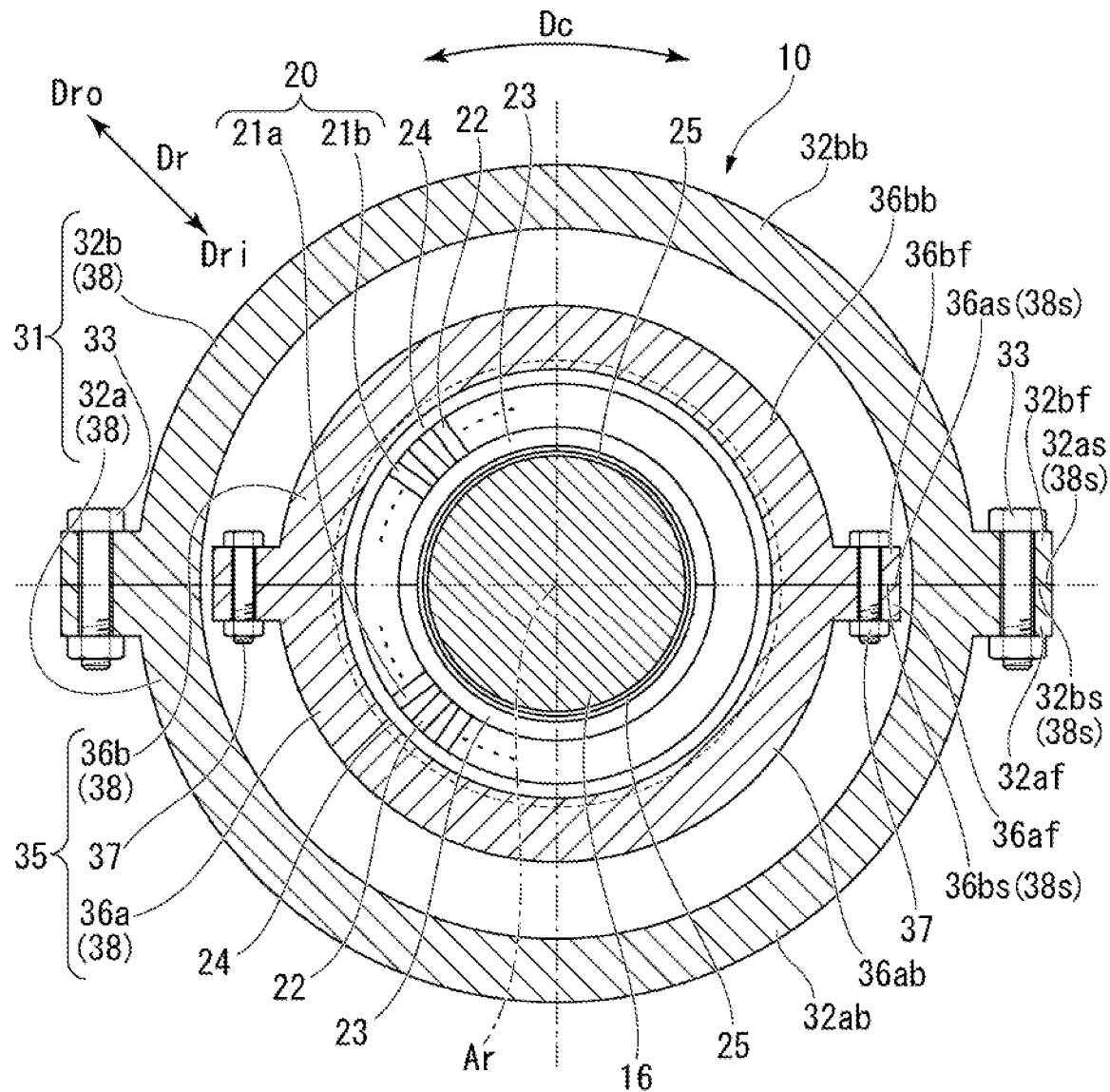
FIG. 4 is a cross-sectional view taken along a line IV-IV in FIG. 3.
Figure 5:
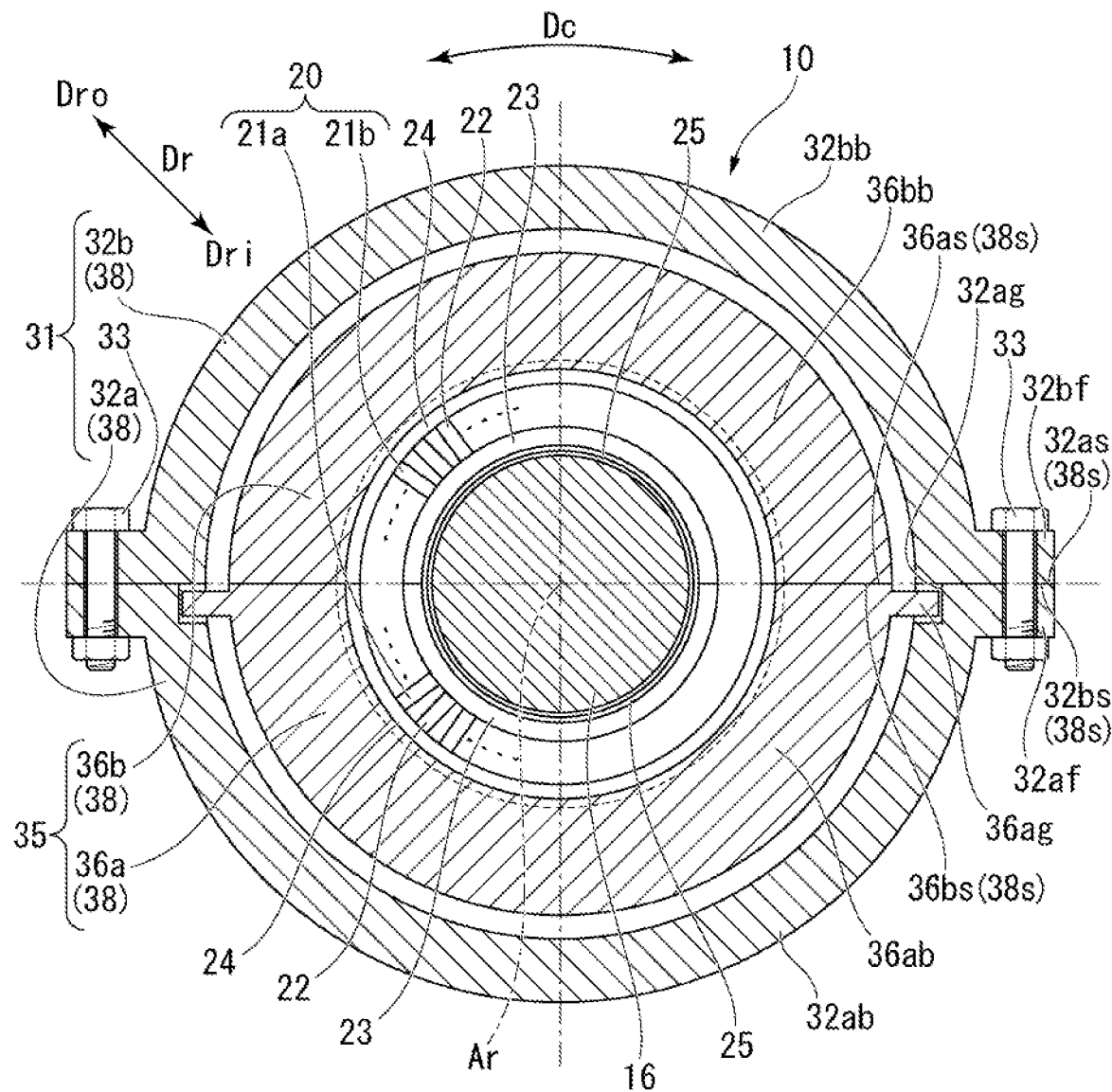
FIG. 5 is a cross-sectional view taken along a line V-V in FIG. 3.

As illustrated in FIGS. 3 to 5, the outer casing 31 includes a lower half outer casing 32a that constitutes a portion below the axis Ar, an upper half outer casing 32b that constitutes a portion above the axis Ar, and a plurality of bolts 33 for fastening the upper half outer casing 32b to the lower half outer casing 32a. The lower half outer casing 32a includes an outer casing main body 32ab extending in the circumferential direction Dc and outer casing flanges 32af protruding to the radial outer side Dro from both end portions of the outer casing main body 32ab in the circumferential direction Dc. Similarly, the upper half outer casing 32b includes an outer casing main body 32bb extending in the circumferential direction Dc and outer casing flanges 32bf protruding to the radial outer side Dro from both end portions of the outer casing main body 32bb in the circumferential direction Dc. The outer casing flange 32af of the lower half outer casing 32a and the outer casing flange 32bf of the upper half outer casing 32b face each other in an up-down direction. The plurality of bolts 33 extend through the outer casing flange 32af of the lower half outer casing 32a and the outer casing flange 32bf of the upper half outer casing 32b to fasten the outer casing flange 32af of the lower half outer casing 32a and the outer casing flange 32bf of the upper half outer casing 32b. A surface in the outer casing flange 32af of the lower half outer casing 32a that opposes the outer casing flange 32bf of the upper half outer casing 32b forms a flange surface 32as. Further, a surface in the outer casing flange 32bf of the upper half outer casing 32b that opposes the outer casing flange 32af of the lower half outer casing 32a forms a flange surface 32bs. As illustrated in FIG. 5, a support groove 32ag that is recessed from the flange surface 32as and is recessed from the inner peripheral surface toward the outer peripheral surface of the outer casing main body 32ab is formed at a part of each end portion of the lower half outer casing 32a in the circumferential direction Dc.

As illustrated in FIGS. 4 and 5, the inner casing 35 includes a lower half inner casing 36a that constitutes a portion below the axis Ar, an upper half inner casing 36b that constitutes a portion above the axis Ar, and a plurality of bolts 37 for fastening the upper half inner casing 36b to the lower half inner casing 36a. The lower half inner casing 36a includes an inner casing main body 36ab extending in the circumferential direction Dc and inner casing flanges 36af protruding to the radial outer side Dro from both end portions of the inner casing main body 36ab in the circumferential direction Dc. Similarly, the upper half inner casing 36b includes an inner casing main body 36bb extending in the circumferential direction Dc and inner casing flanges 36bf protruding to the radial outer side Dro from both end portions of the inner casing main body 36bb in the circumferential direction Dc. The inner casing flange 36af of the lower half inner casing 36a and the inner casing flange 36bf of the upper half inner casing 36b oppose each other in the up-down direction. The plurality of bolts 37 extend through the inner casing flange 36af of the lower half inner casing 36a and the inner casing flange 36bf of the upper half inner casing 36b to fasten the inner casing flange 36af of the lower half inner casing 36a and the inner casing flange 36bf of the upper half inner casing 36b. A surface in the inner casing flange 36af of the lower half inner casing 36a that opposes the inner casing flange 36bf of the upper half inner casing 36b forms a flange surface 36as. Further, a surface in the inner casing flange 36bf of the upper half inner casing 36b that opposes the inner casing flange 36af of the lower half inner casing 36a forms a flange surface 36bs. As illustrated in FIG. 5, the lower half inner casing 36a further includes support-receiving parts 36ag being parts of the inner casing main body 36ab in the axial direction Da that protrude to the radial outer side Dro from both ends of the inner casing main body 36ab in the circumferential direction Dc. The lower half inner casing 36a is supported by the lower half outer casing 32a by fitting the support-receiving parts 36ag into the support grooves 32ag of the lower half outer casing 32a.

Note that the lower half outer casing 32a and the upper half outer casing 32b constitute casing components 38 of the outer casing 31.

In addition, the lower half inner casing 36a and the upper half inner casing 36b constitute casing components 38 of the inner casing 35.

The plurality of diaphragms 20 are aligned in the inner casing 35 in the axial direction Da. As illustrated in FIG. 4, each of the plurality of diaphragms 20 includes a lower half diaphragm 21a that constitutes a portion below the axis Ar and an upper half diaphragm 21b that constitutes a portion above the axis Ar. Each of the lower half diaphragm 21a and the upper half diaphragm 21b includes a plurality of stator vanes 22 aligned in the circumferential direction Dc, a diaphragm inner ring 23 that connects portions of the plurality of stator vanes 22 at the radial inner side Dri to each other, and a diaphragm outer ring 24 that connects portions of the plurality of stator vanes 22 at the radial outer side Dro to each other. The lower half diaphragm 21a is mounted on the inner peripheral side of the lower half inner casing 36a, and the upper half diaphragm 21b is mounted on the inner peripheral side of the upper half inner casing 36b. A sealing device 25 that seals a gap between the diaphragm inner ring 23 and the rotor shaft 16 is provided on the inner peripheral side of the diaphragm inner ring 23.

The lower half diaphragms 21a and the upper half diaphragms 21b for each of the plurality of diaphragms 20, as well as the casing components described above, all constitute stationary body components, which are components constituting the stationary body.

Figure 6:
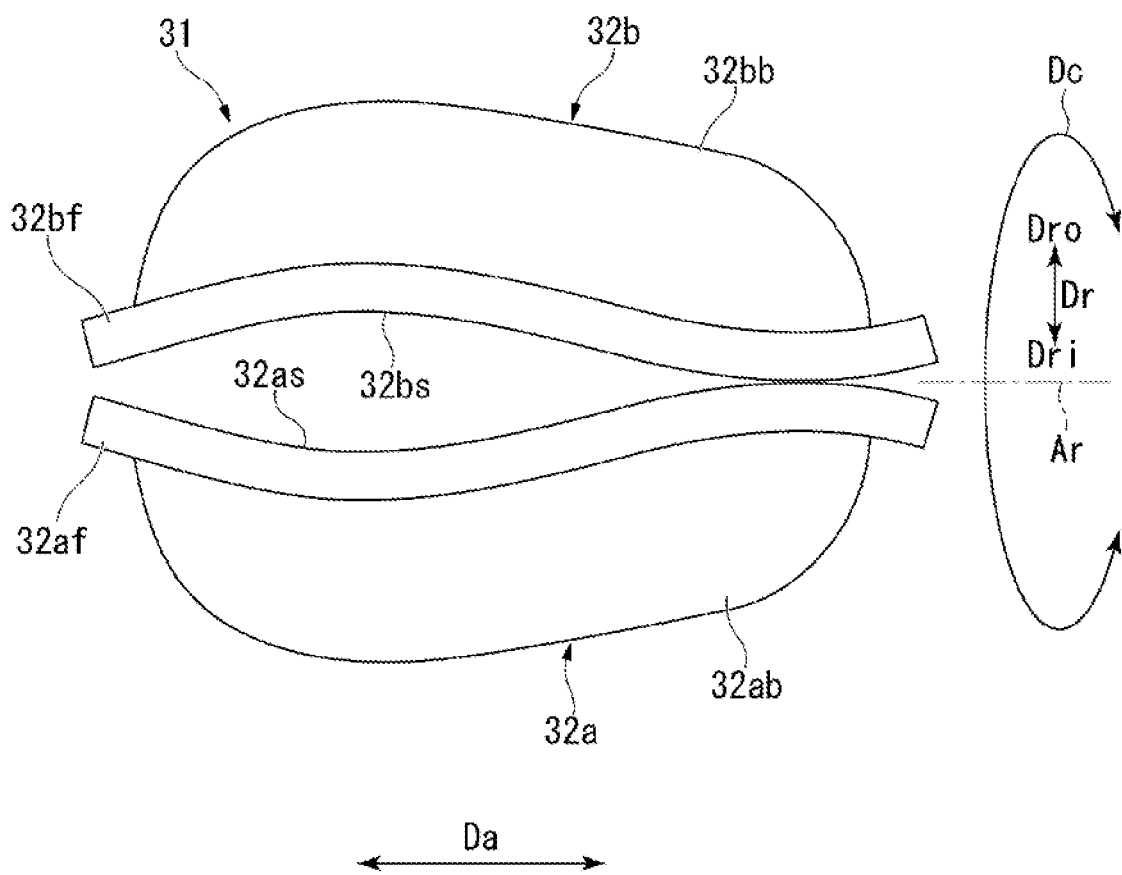
FIG. 6 is a side view illustrating the steam turbine in an open state after deformation in the embodiment according to the present disclosure.
Figure 7:
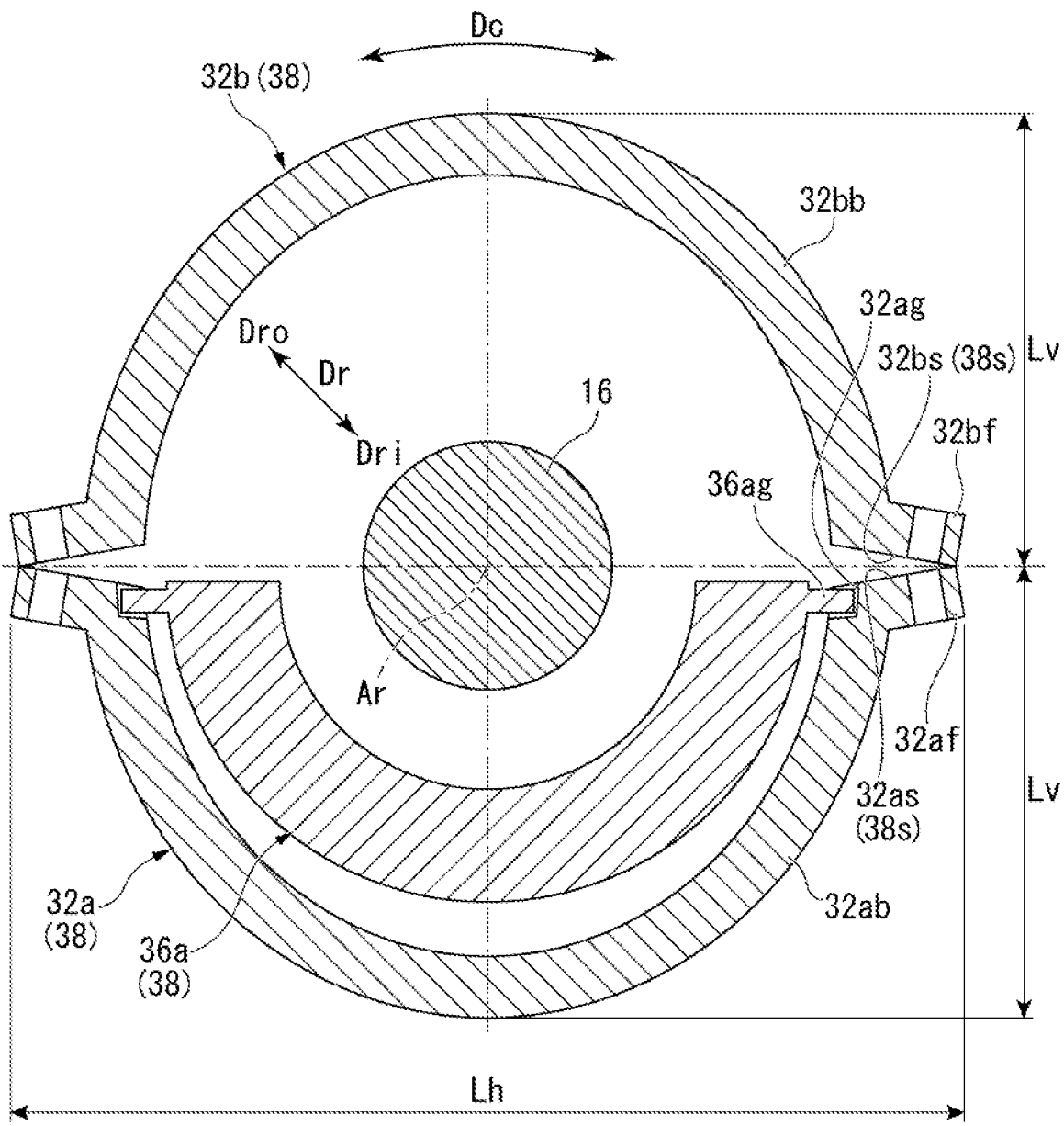
FIG. 7 is a cross-sectional view illustrating the steam turbine in the open state after deformation in the embodiment according to the present disclosure.

An inner peripheral surface of the outer casing 31 and an inner peripheral surface of the inner casing 35 are exposed to high-temperature steam generated by operating the steam turbine 10. Thus, the outer casing 31 and the inner casing 35 undergo inelastic deformation such as creep deformation due to the operation of the steam turbine 10. As a result of this deformation, in a state in which the upper half outer casing 32b is not fastened to the lower half outer casing 32a, as illustrated in FIG. 6, the outer casing flanges 32af and 32bf change position in the up-down direction depending on the position in the axial direction Da. Further, as illustrated in FIG. 7, a dimension Lv of the lower half outer casing 32a and the upper half outer casing 32b in the up-down direction becomes longer, and a dimension Lh in a lateral direction perpendicular to the axis Ar becomes shorter. Furthermore, the flange surface 32as of the lower half outer casing 32a is inclined so that a portion on the radial outer side Dro is located above a portion on the radial inner side Dri, and the flange surface 32bs of the upper half outer casing 32b is inclined so that a portion on the radial outer side Dro is located below a portion on the radial inner side Dri.

Note that the cross section of the steam turbine 10 illustrated in FIG. 7 is a cross section at a certain position in the axial direction Da. Thus, in the cross section at other positions in the axial direction Da, contrary to the case above, the flange surface 32as of the lower half outer casing 32a may be inclined so that a portion on the radial outer side Dro is located below a portion on the radial inner side Dri, and the flange surface 32bs of the upper half outer casing 32b may be inclined so that a portion on the radial outer side Dro is located above a portion on the radial inner side Dri.

Figure 8:
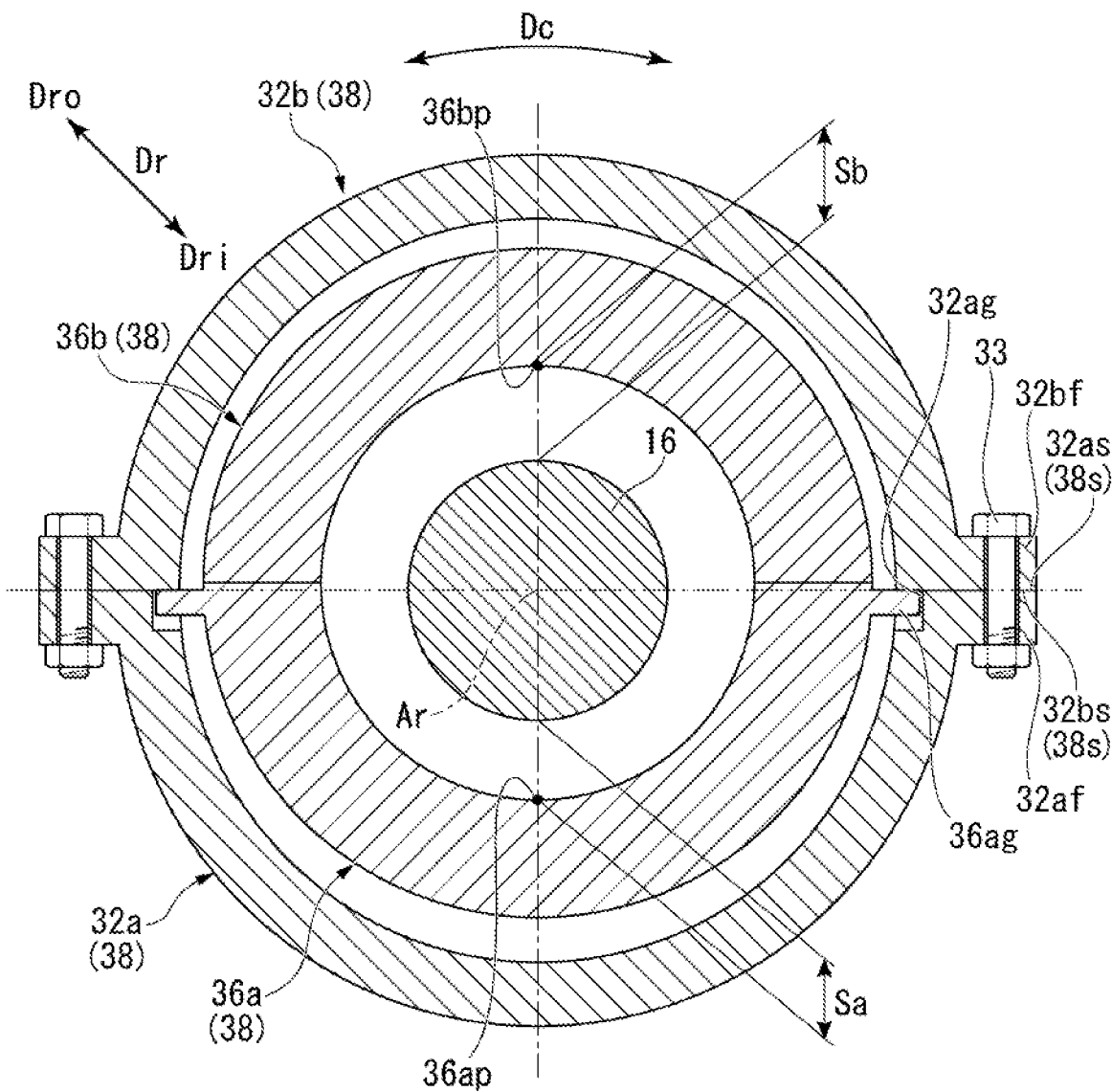
FIG. 8 is a cross-sectional view illustrating the steam turbine in a fastened state after deformation in the embodiment according to the present disclosure.

When the upper half outer casing 32b deformed as described above is fastened to the lower half outer casing 32a deformed as described above, the dimensions of the lower half outer casing 32a and the upper half outer casing 32b become shorter in the up-down direction and longer in the lateral direction perpendicular to the axis Ar than before fastening, as illustrated in FIG. 8. Further, the flange surface 32as of the lower half outer casing 32a and the flange surface 32bs of the upper half outer casing 32b are widened substantially in a horizontal direction. As a result, the lower half inner casing 36a, which is supported by the lower half outer casing 32a, and the upper half inner casing 36b, which is fastened to the lower half inner casing 36a, are moved upward relative to the axis Ar. Thus, an interval Sa in the radial direction Dr between a lowest point 36ap in the inner peripheral surface of the lower half inner casing 36a and the rotor shaft 16 becomes smaller than the allowable range, and an interval Sb in the radial direction Dr between an uppermost point 36bp in the inner peripheral surface of the upper half inner casing 36b and the rotor shaft 16 becomes larger than the allowable range.

Thus, in the method disclosed as the existing technology in Patent Document 1 described in the Background Art section, the primary temporary assembly is performed, and the gap between the stationary body affected by the deformation of the casing and the rotating body when the casing components are fastened to each other is measured. The relative position of the stationary body to the rotating body is then adjusted based on the measurement result.

Embodiment of Assembly Support Device for Turbine

Figure 9:
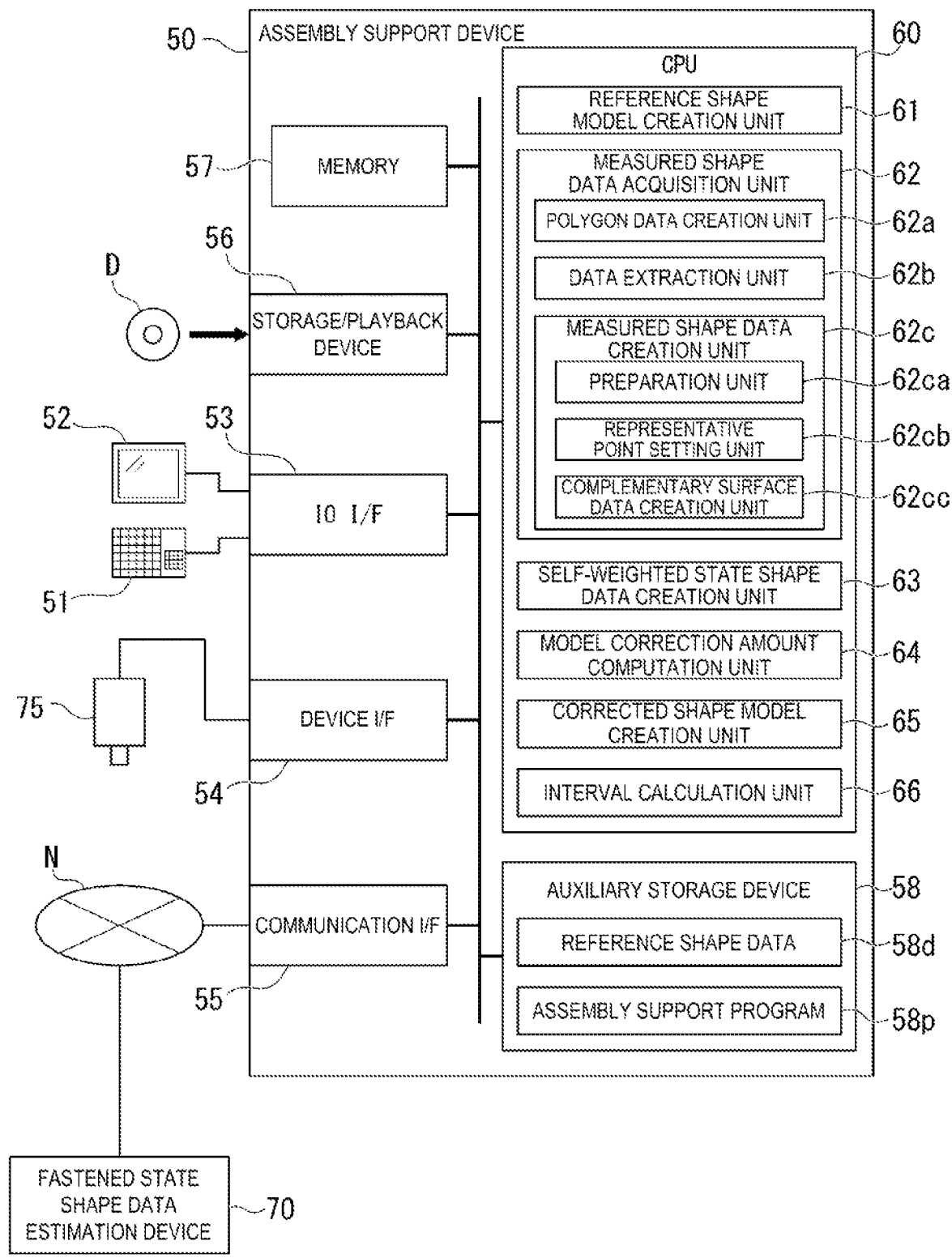
FIG. 9 is an explanatory diagram illustrating a configuration of an assembly support device in the embodiment according to the present disclosure.

An assembly support device for a turbine according to the present embodiment will be described with reference to FIG. 9.

An assembly support device 50 is a computer. The assembly support device 50 includes a CPU (central processing unit) 60 that performs various operations, a memory 57 that serves as a working area or the like for the CPU 60, an auxiliary storage device 58 such as a hard disk drive device, a manual input device (input device) 51 such as a keyboard or a mouse, a display device (output device) 52, an input/output interface 53 for the manual input device 51 and the display device 52, a device interface (input device) 54 for transmitting and receiving data to and from a three-dimensional shape measuring device 75 such as a three-dimensional laser measuring device, a communication interface (input/output device) 55 for communicating with the outside via a network N, and a storage/playback device (input/output device) 56 that performs data storage processing and playback processing for a disk storage medium D.

The auxiliary storage device 58 stores in advance an assembly support program 58p and reference shape data 58d, which is design data for each of the plurality of components constituting the steam turbine 10. The assembly support program 58p is imported into the auxiliary storage device 58 from the disk storage medium D via the storage/playback device 56, for example. Note that the assembly support programs 58p may be imported into the auxiliary storage device 58 from an external device via the communication interface 55.

The CPU 60 functionally includes a reference shape model creation unit 61, a measured shape data acquisition unit 62, a self-weighted state shape data creation unit 63, a model correction amount computation unit 64, a corrected shape model creation unit 65, and an interval calculation unit 66. The measured shape data acquisition unit 62 includes a polygon data creation unit 62a, a data extraction unit 62b, and a measured shape data creation unit 62c. The measured shape data creation unit 62c includes a preparation unit 62ca, a representative point setting unit 62cb, and a complementary surface data creation unit 62cc. Each of these functional units 61 to 66 functions by the CPU 60 executing the assembly support program 58p stored in the auxiliary storage device 58.

The assembly support device 50 is connected to a fastened state shape data estimation device 70 via the network N. The fastened state shape data estimation device 70 is also a computer. Note that the operations of each of the functional units 61 to 66 of the assembly support device 50 and the operation of the fastened state shape data estimation device 70 will be described later.

Embodiment of Assembly Method for Turbine

An assembly method for a turbine according to the present embodiment will be described in accordance with flowcharts illustrated in FIGS. 10 and 11. Note that in the flowcharts in FIGS. 10 and 11, steps surrounded by solid lines are work steps performed by a worker, and steps surrounded by dashed lines are steps performed by the assembly support device 50 or the fastened state shape data estimation device 70.

The steam turbine 10 is disassembled and reassembled each time an inspection or the like is performed. When disassembly of the steam turbine 10 is complete, the upper half outer casing 32b is removed from the lower half outer casing 32a, the upper half inner casing 36b is removed from the lower half inner casing 36a, the rotor 15 is placed outside of the casing 30, and the plurality of diaphragms 20 are removed from the inner casing 35. Each diaphragm 20 is separated into the lower half diaphragm 21a and the upper half diaphragm 21b. Note that, the lower half outer casing 32a may be removed from the frames 11 when disassembly of the steam turbine 10 is complete, but here, it is assumed that the lower half outer casing 32a is supported by the frames 11.

Figure 10:
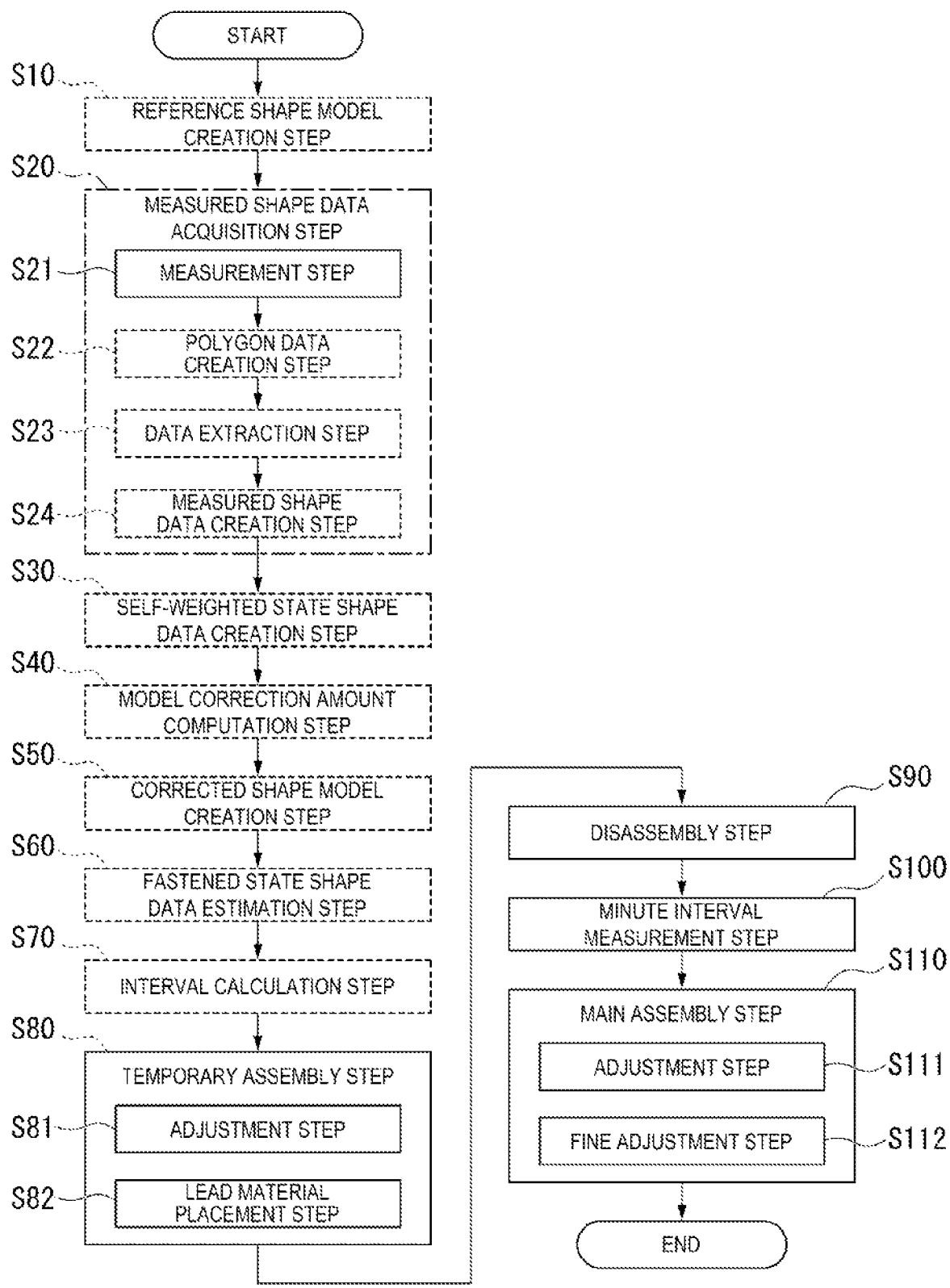
FIG. 10 is a flowchart illustrating a procedure of an assembly method in the embodiment according to the present disclosure.
Figure 11:
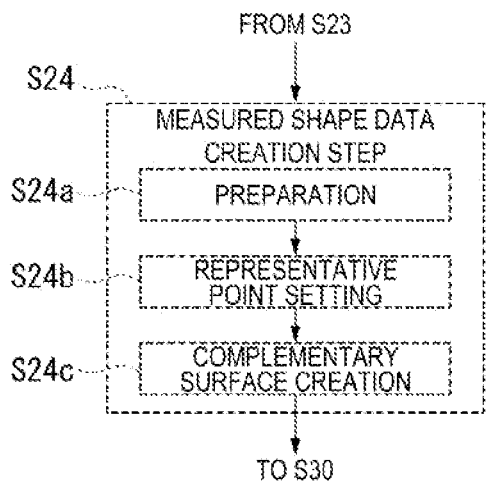
FIG. 11 is a flowchart illustrating details of a measured shape data creation step in FIG. 10.
Figure 12:
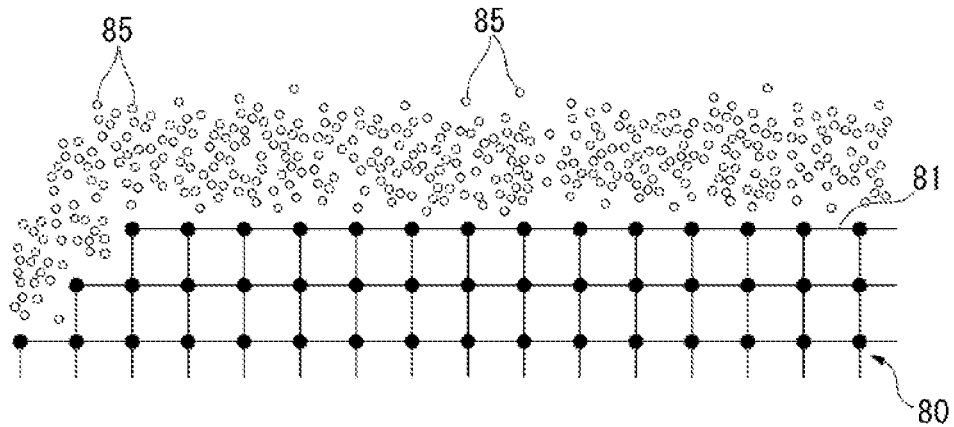
FIG. 12 is an explanatory diagram illustrating a relative positional relationship between a flange surface in a reference shape model and a plurality of points actually measured in a region including an actual flange surface, in the embodiment according to the present disclosure.

In the assembly method for a turbine, first, as illustrated in the flowchart in FIG. 10, the reference shape model creation unit 61 of the assembly support device 50 creates a reference shape model (S10: reference shape model creation step). The reference shape model creation unit 61 reads the reference shape data 58d, which is the design data for each of the plurality of components constituting the steam turbine 10, from the auxiliary storage device 58. Next, based on the reference shape data 58d for each of the plurality of components, a reference shape model for each of the plurality of components is created. As illustrated in FIG. 12, a reference shape model 80 is a model in which a component is divided into a plurality of minute elements in the form of a mesh in order to simulate deformation or the like of the component by a finite element method or the like. After creating the reference shape model 80, the reference shape model creation unit 61 stores the reference shape model 80 in the auxiliary storage device 58.

In the present embodiment, as described above, when creating the reference shape model 80, the design data is used as the reference shape data 58d. However, as long as the data is related to the shape of the component before the steam turbine 10 is shipped from the manufacturing plant, shape data obtained by actually measuring the component may be used as the reference shape data. In the present embodiment, the reference shape model creation step (S10) is performed after the disassembly of the steam turbine 10 is complete. However, the reference shape model creation step (S10) may be performed before the disassembly of the steam turbine 10, for example, during the operation of the steam turbine 10.

Subsequently, measured shape data for each of the plurality of casing components 38 (lower half outer casing 32a, upper half outer casing 32b, lower half inner casing 36a, and upper half inner casing 36b) is acquired by measuring the shape of a target measurement part predetermined for each of the casing components 38 after disassembly is complete (S20: measured shape data acquisition step). The target measurement parts in the lower half outer casing 32a and the upper half outer casing 32b are the respective flange surfaces 38s (flange surfaces 32as and 32bs). Further, the target measurement parts in the lower half inner casing 36a and the upper half inner casing 36b are the respective flange surfaces 38s (flange surfaces 36as and 36bs). The measured shape data acquisition step (S20) includes a measurement step (S21), a polygon data creation step (S22), a data extraction step (S23), and a measured data creation step (S24).

In the measurement step (S21), the worker measures the three-dimensional position data of the plurality of points in a region including the target measurement part for each of the plurality of casing components 38 by using the three-dimensional shape measuring device 75, for example, a three-dimensional laser measuring device. At this time, the three-dimensional position data at a plurality of points to be measured is measured with reference to a reference point predetermined for each of the plurality of casing components 38.

Compared to before fastening the plurality of casing components 38 to each other, the deformation of each of the casing components 38 after fastening the plurality of casing components 38 to each other is greatly affected by the deformation of the flange surface 38s of each of the plurality of casing components 38. For this reason, in the present embodiment, in the measurement step (S21), the region where the shape is actually measured in the casing component 38 is limited to the flange surface 38s. Thus, in the present embodiment, in the measurement step (S21), the region where the shape is actually measured in the casing component 38 can be made small, so that the time and effort taken to actually measure the shape of the casing component 38 can be reduced. Further, it is possible to reduce the load on the computer during a model correction amount computation step (S40) and a corrected shape model creation step (S50) described below.

Figure 13:
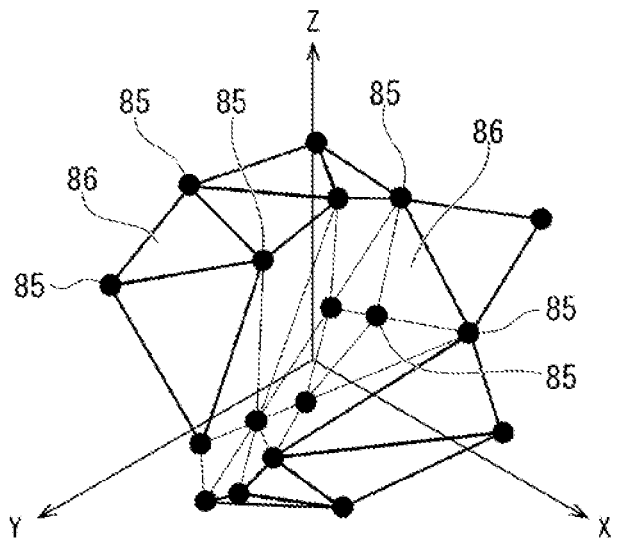
FIG. 13 is an explanatory diagram for describing a plurality of polygon data in the embodiment according to the present disclosure.

In the polygon data creation step (S22), the polygon data creation unit 62a of the assembly support device 50 acquires the three-dimensional position data of the plurality of points for each of the plurality of casing components 38 measured in the measurement step (S21), as illustrated in FIG. 12. Note that FIG. 12 is an illustrative diagram illustrating a relative positional relationship between a flange surface 81, which is the target measurement part in the reference shape model 80 of the casing component 38, and a plurality of points 85 actually measured in the region including the actual flange surface 38s. The polygon data creation unit 62a then creates a plurality of polygon data for each of the plurality of casing components 38 using the three-dimensional position data of the plurality of points 85, as illustrated in FIG. 13. The polygon data is data that defines a polygonal plane. The polygon data creation unit 62a connects a plurality of points 85 that are close to one another among the plurality of points 85 with line segments. A polygon plane surrounded by these line segments is referred to as a polygon 86.

Figure 14:
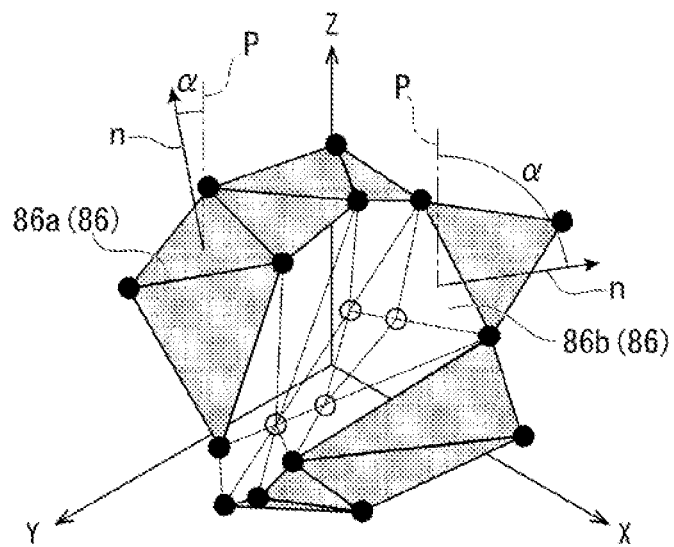
FIG. 14 is an explanatory diagram for describing extraction of a specific plurality of the polygon data in a data extraction step in the embodiment according to the present disclosure.

In the data extraction step (S23), as illustrated in FIG. 14, the data extraction unit 62b of the assembly support device 50 extracts, for each of the plurality of casing components 38, a plurality of polygon data that satisfy a certain condition from the plurality of polygon data created in the polygon data creation step (S22). Note that in FIG. 14, polygons 86a identified by the polygon data to be extracted are patterned, and polygons 86b identified by the polygon data not to be extracted are not patterned. Further, an XY plane in FIG. 14 is a plane parallel to the flange surface 81 in the reference shape model 80. Here, the condition described above is that an inclination of the polygon 86 identified by the polygon data with respect to the flange surface 81 in the reference shape model 80 is within a predetermined inclination. The data extraction unit 62b first obtains a normal line n of the polygon 86 for each of the plurality of polygons 86. Next, the data extraction unit 62b obtains an angle α between a perpendicular line p to the flange surface 81 in the reference shape model 80 and the normal line n of the polygon 86 for each of the plurality of polygons 86. Then, the data extraction unit 62b extracts, from the plurality of polygon data, a plurality of polygon data in which the angle α between the perpendicular line p to the flange surface 81 and the normal line n of the polygon 86 is within a predetermined angle (predetermined inclination).

Figure 15:
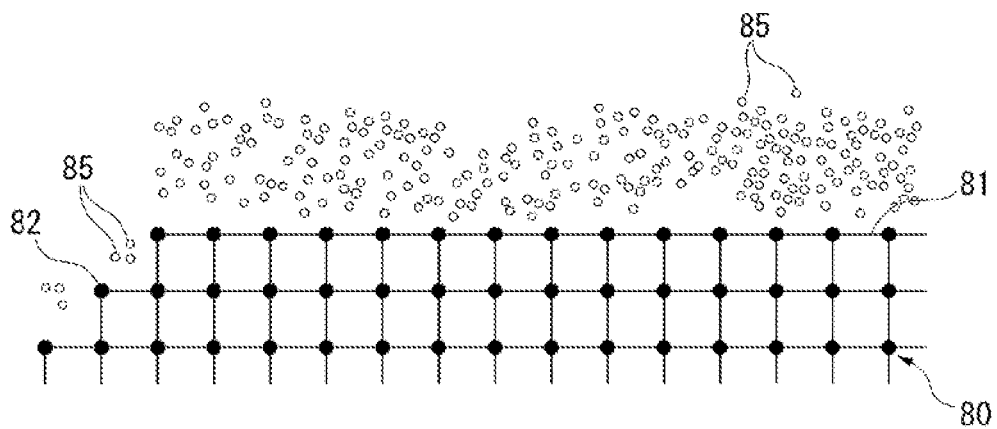
FIG. 15 is an explanatory diagram illustrating a relative positional relationship between the flange surface in the reference shape model and a plurality of points after the data extraction step among a plurality of points actually measured in the region including the actual flange surface, in the embodiment according to the present disclosure.

The data extraction step (S23) is performed to exclude, from the three-dimensional position data of the plurality of points 85 obtained in the measurement step (S21), the three-dimensional position data of the points in a wall of an edge of the flange surface 38s and the points on inner peripheral surfaces of through-holes of the bolts 33, 37 extending through the flange surfaces 38s. Thus, as illustrated in FIG. 15, the number of the points 85 after the data extraction step (S23) is less than the number of the points 85 before the data extraction step (S23). In particular, the number of the points 85 after the extraction step (S23) is significantly less than the number of the points 85 before the data extraction step (S23) for a surface 82 that is inclined with respect to the flange surface 81 in the reference shape model 80.

In the measured data creation step (S24), the measured shape data creation unit 62c of the assembly support device 50 creates the measured shape data for each of the plurality of casing components 38 using the plurality of polygon data extracted in the data extraction step (S23). The measured data creation step (S24) includes a preparation step (S24a), a representative point setting step (S24b), and a complementary surface data creation step (S24c), as illustrated in the flowchart in FIG. 11.

Figure 16:
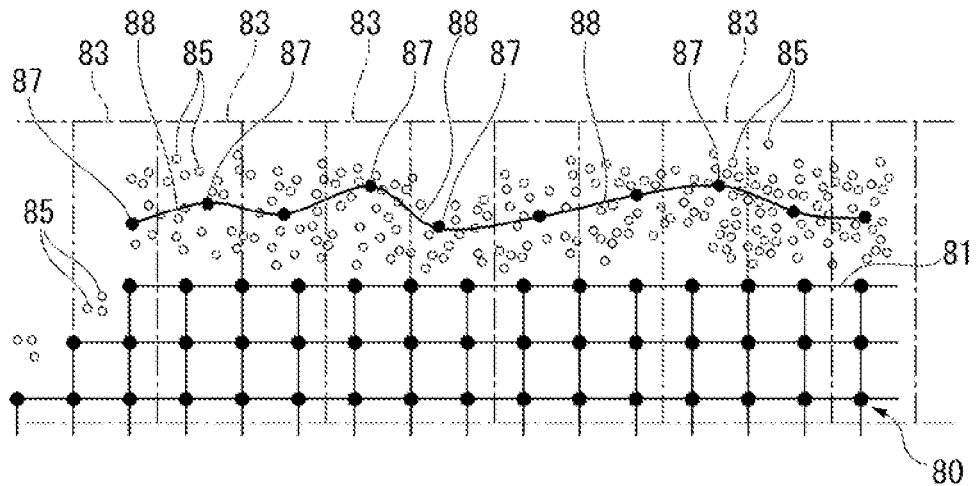
FIG. 16 is an explanatory diagram for describing processing content in a preparation step, a representative point setting step, and a complementary surface data creation step in the embodiment according to the present disclosure.

In the preparation step (S24a), as illustrated in FIG. 16, the preparation unit 62ca of the measured shape data creation unit 62c divides a virtual three-dimensional space including the flange surface 81, which is the target measurement part for each of the plurality of casing components 38, into a plurality of three-dimensional blocks 83.

In the representative point setting step (S24b), the representative point setting unit 62cb of the measured shape data creation unit 62c sets a representative point 87 in a target three-dimensional block 83 for each of the plurality of three-dimensional blocks 83. Specifically, the representative point setting unit 62cb sets a point that is a median of the three-dimensional position data of the plurality of points 85 included in the target three-dimensional block 83 as the representative point 87 in the target three-dimensional block 83, among the plurality of points 85 included in the polygons identified by the plurality of polygon data extracted in the data extraction step (S23). Note that, in FIG. 16, among the plurality of points 85 in the figure, the black points indicate the representative points 87.

In the complementary surface data creation step (S24c), the complementary surface data creation unit 62cc of the measured shape data creation unit 62c creates data of a complementary surface 88 including the representative point 87 for each of the plurality of three-dimensional blocks 83 by connecting the respective representative points 87 for each of the plurality of three-dimensional blocks 83 to each other with a plane or a curved surface as the complementary surface 88. The data of the complementary surface 88 is the measured shape data created by the measured shape data creation unit 62c.

The three-dimensional position data related to the point 85 obtained by the three-dimensional shape measuring device 75 contains an error. For example, when the three-dimensional shape measuring device 75 is a three-dimensional laser measuring device, the three-dimensional position data measured by the three-dimensional laser measuring device will contain the error when there is a minute floating object between the measurement target and the three-dimensional laser measuring device. Thus, in the present embodiment, an error range of the three-dimensional position data related to the point 85 obtained by the three-dimensional shape measuring device 75 is narrowed by setting the point that is the median of the three-dimensional position data of the plurality of points 85 included in the three-dimensional block 83 as the representative point 87 in the three-dimensional block 83. Note that when the number of the plurality of points 85 included in the three-dimensional block 83 is extremely small, the representative point 87 is not set for this three-dimensional block 83. This is because when the number of the points 85 is extremely small, even when the representative point 87 is set among the plurality of points 85, the error range of the three-dimensional position data of the representative point 87 is not necessarily narrowed.

In addition, in the present embodiment, the respective representative points 87 for each of the plurality of three-dimensional blocks 83 are connected to each other with a plane or a curved surface to create the data of the complementary surface 88 including the representative point 87 for each of the plurality of three-dimensional blocks 83. Then, the data of the complementary surface 88 is set as the measured shape data. Thus, in the present embodiment, it is possible to obtain the measured shape data related to the flange surface 38s that is continuous over the entire flange surface 81 on the reference shape model 80 and has a narrow error range.

In the present embodiment, after the data extraction step (S23), the preparation step (S24a) in the measured shape data creation step (S24) is performed. However, the preparation step (S24a) may be performed at any stage after the reference shape model creation step (S10) and before the representative point setting step (S24b) in the measured shape data creation step (S24). Thus, for example, the preparation step (S24a) may be performed immediately after the reference shape model 80 is created in the reference shape model creation step (S10).

Figure 17:
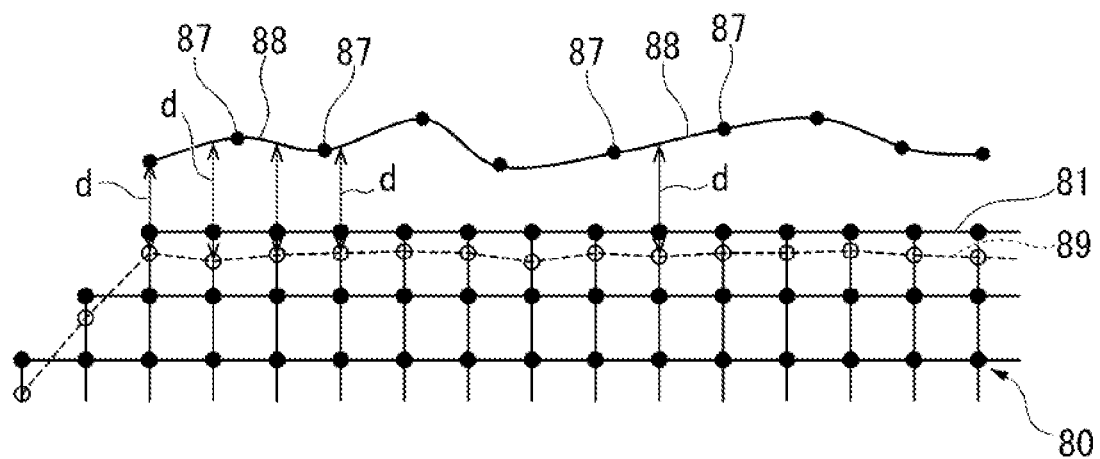
FIG. 17 is an explanatory diagram for describing processing content in a model correction amount computation step in the embodiment according to the present disclosure.

Subsequently, the self-weighted state shape data creation unit 63 of the assembly support device 50 creates self-weighted state shape data 89, which is shape data when self-weight is applied to each of the plurality of casing components 38, as illustrated in FIG. 17, using the reference shape model 80 for each of the plurality of casing components 38, for each of the plurality of casing components 38 (S30: self-weighted state shape data creation step). Note that the self-weighted state shape data 89 is shape data when self-weight is applied to the casing component 38 in the same orientation as the orientation of the casing component 38 when the shape of the target measurement part is actually measured. Thus, in the present embodiment, after the measured shape data acquisition step (S20), the self-weighted state shape data creation step (S30) is performed. However, in a case in which the orientation of the casing component 38 when actually measuring the shape of the target measurement part is predetermined in the measured shape data acquisition step (S20), the self-weighted state shape data creation step (S30) may be performed before the measured shape data acquisition step (S20) and after the reference shape model creation step (S10).

Subsequently, as illustrated in FIG. 17, the model correction amount computation unit 64 of the assembly support device 50 computes a model correction amount of the reference shape model from a difference d between the measured shape data 88 of the target measurement part and the self-weighted state shape data 89 of the target measurement part, for each of the plurality of casing components 38 (S40: model correction amount computation step).

Figure 18:
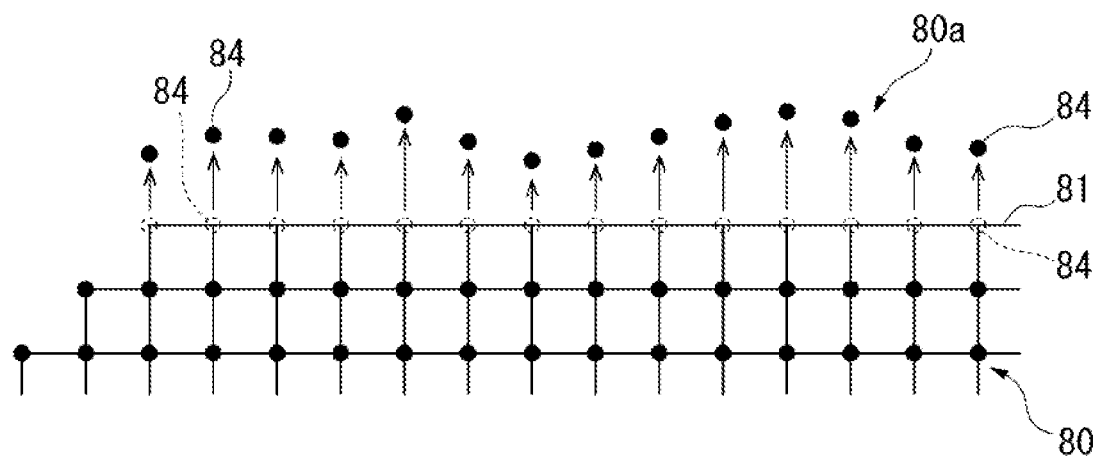
FIG. 18 is an explanatory diagram for describing processing content in a corrected shape model creation step in the embodiment according to the present disclosure.

Subsequently, as illustrated in FIG. 18, the corrected shape model creation unit 65 of the assembly support device 50 creates a corrected shape model 80a by correcting the reference shape model 80 for each of the plurality of casing components 38 by using the model correction amount for each of the plurality of casing components 38 (S50: corrected shape model creation step). Specifically, here, grids 84 included in the flange surface 81 in the reference shape model 80 are moved by the amounts of model correction.

Subsequently, the fastened state shape data estimation device 70, after receiving the corrected shape model 80a for each of the plurality of casing components 38 from the assembly support device 50, estimates the fastened state shape data, which is shape data for each of the plurality of casing components 38 in a state in which the plurality of casing components 38 are fastened to each other, by using the corrected shape model 80a for each of the plurality of casing components 38 (S60: fastened state shape data estimation step). At this time, the fastened state shape data estimation device 70 estimates the fastened state shape data in consideration of the material of each of the plurality of casing components 38, the degree of deterioration of the material of each of the plurality of casing components 38 due to the operation of the steam turbine 10, the fastening force between the plurality of casing components 38 by the bolts 33, 37, the self-weight applied to each of the plurality of casing components 38, and the like. That is, the fastened state shape data estimation device 70 simulates the shape deformation for each of the plurality of casing components 38 in a state in which the plurality of casing components 38 are fastened to each other based on a state in which the plurality of casing components 38 are not fastened to each other.

Subsequently, the interval calculation unit 66 of the assembly support device 50 receives the fastened state shape data for each of the plurality of casing components 38 from the fastened state shape data estimation device 70. Then, the interval calculation unit 66 calculates the interval at a predetermined portion among the intervals between the stationary body and the rotating body in a state where the plurality of casing components 38 are fastened to each other and the plurality of stationary body components and the rotating body are assembled to each other, by using the fastened state shape data for each of the plurality of casing components 38 and the reference shape data 58d for the rotating body (S70: interval calculation step). The interval at the predetermined portion among the intervals between the stationary body and the rotating body is, for example, the interval Sa between the lowest point 36ap in the inner peripheral surface of the lower half inner casing 36a and the rotor shaft 16 in the radial direction Dr, or the interval Sb between the uppermost point 36bp in the inner peripheral surface of the upper half inner casing 36b and the rotor shaft 16 in the radial direction Dr, as illustrated in FIG. 8.

Note that in the fastened state shape data estimation step (S60), the amount of change in the interval at the predetermined portion among the intervals between the stationary body and the rotating body, in the state after fastening the plurality of casing components 38 to each other may be estimated based on the state before fastening. In this case, in the interval calculation step (S70), the value obtained by adding the amount of change described above to the interval at the predetermined portion among the intervals between the stationary body and the rotating body actually measured before fastening may be used as the interval after fastening. Even in the above case, ultimately, the fastened state shape data, which is the shape data for each of the plurality of casing components 38 in the state in which the plurality of casing components 38 are fastened to each other, is estimated in the fastened state shape data estimation step (S60), and the interval at the predetermined portion is calculated using the fastened state shape data for each of the plurality of casing components 38 in the interval calculation step (S70).

Subsequently, the worker performs the temporary assembly step (S80). In the temporary assembly step (S80), first, the lower half inner casing 36a is placed in the lower half outer casing 32a supported by the frames 11.

Next, the lower half diaphragm 21a of each of the plurality of diaphragms 20 is attached to the lower half inner casing 36a. Next, the bearings 12 and the rotor 15 are attached to the frames 11. At this time, the rotor 15 is centered. Specifically, the relative positions of the bearings 12 to the respective frames 11, and the relative position of the rotor 15 to the bearings 12 are adjusted. Next, the upper half diaphragms 21b are attached to the lower half diaphragms 21a. Next, the upper half inner casing 36b is fastened to the lower half inner casing 36a. Next, the upper half outer casing 32b is fastened to the lower half outer casing 32a.

In the temporary assembly step (S80), in addition to the above work, an adjustment step (S81) and a lead member placement step (S82) are performed.

Figure 19:
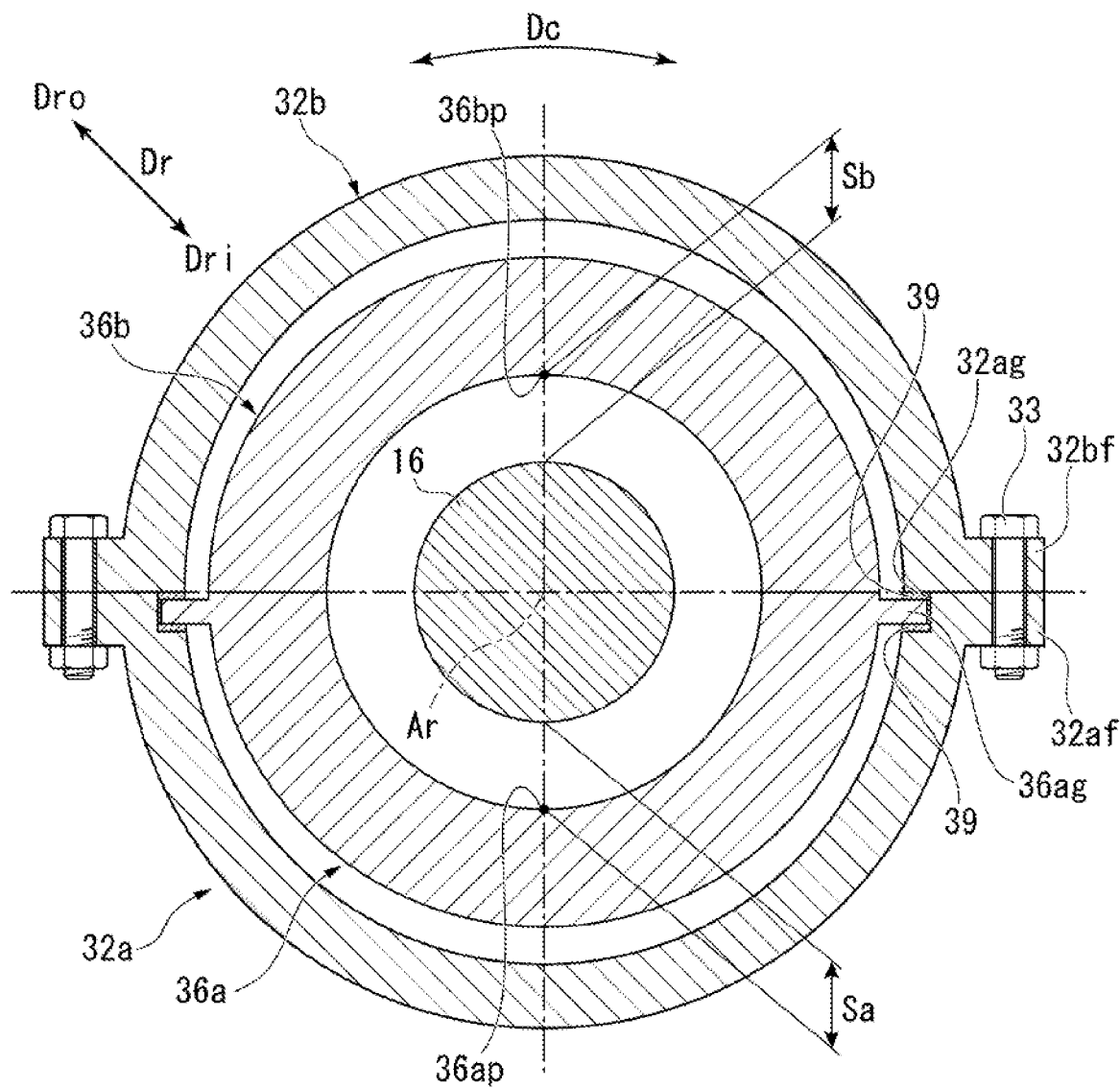
FIG. 19 is a cross-sectional view illustrating the steam turbine in a fastened state after an adjustment step in the embodiment according to the present disclosure.

In the adjustment step (S81), among the plurality of stationary body components, shims are placed at portions where a certain stationary body component is attached to another stationary body component. For example, the shims are placed in the support groove 32ag of the lower half outer casing 32a in which the support-receiving part 36ag of the lower half inner casing 36a is held, between the lower half inner casing 36a and the lower half diaphragm 21a, and between the upper half inner casing 36b and the upper half diaphragm 21b. In this step, the thickness of each shim, the number of shims, or the like is determined so that the interval at the predetermined portion among the intervals between the stationary body and the rotating body, which is calculated in the interval calculation step (S70), is within the predetermined allowable range. Specifically, for example, it is assumed that as a result of estimating the fastened state shape data for each of the casing components 38 in the fastened state shape data estimation step (S60), as illustrated in FIG. 8, the interval Sa between the lowest point 36ap in the inner peripheral surface of the lower half inner casing 36a and the rotor shaft 16 in the radial direction Dr becomes smaller than the allowable range, and the interval Sb between the uppermost point 36bp in the inner peripheral surface of the upper half inner casing 36b and the rotor shaft 16 in the radial direction Dr becomes larger than the allowable range. In this case, the thickness of each shim, the number of shims, or the like to be placed in the support groove 32ag of the lower half outer casing 32a is determined so that the intervals Sa and Sb calculated in the interval calculation step (S70) are within the allowable ranges, respectively. Then, as illustrated in FIG. 19, in the adjustment step (S81), a shim 39 having the previously determined thickness, or the previously determined number of the shims 39 are placed in the support groove 32ag of the lower half outer casing 32a. As a result, the interval Sa in the radial direction Dr between the lowest point 36ap in the inner peripheral surface of the lower half inner casing 36a and the rotor shaft 16 is within the allowable range, and the interval Sb in the radial direction Dr between the uppermost point 36bp in the inner peripheral surface of the upper half inner casing 36b and the rotor shaft 16 is within the allowable range.

In the lead member placement step (S82), a lead member is placed between the rotating body and the stationary body where the sealing device is placed when one component is assembled to another component. At the end of the temporary assembly step (S80), the lead member is sandwiched and crushed between the rotating body and the stationary body.

Subsequently, the steam turbine 10 temporarily assembled as described above is disassembled (S90: disassembly step). In the disassembly step, the lead member placed in the steam turbine 10 in the temporary assembly step (S80) is collected and the thickness of the lead member is measured (S100: minute interval measurement step).

Subsequently, the main assembly is performed (S110: main assembly step). In the main assembly step (S110), various assembly operations similar to the various assembly operations previously performed in the temporary assembly step (S80) are performed. Further, in the main assembly step (S110), an adjustment step (S111) and a fine adjustment step (S112) are performed in addition to the various assembly operations.

In the adjustment step (S111), the shim is placed at a portion where one stationary body component is assembled to another stationary body component, similar to the adjustment step (S81) in the temporary assembly step (S80). However, in the adjustment step (S111), the shim having the thickness or the number of shims determined in the adjustment step (S81) in the temporary assembly step (S80) are placed at the portion where the one stationary body component is assembled to the other stationary body component.

In the fine adjustment step (S112), the height of the sealing device (dimension in the radial direction Dr) is adjusted based on the thickness of the lead member measured in the minute interval measurement step (S100). When the sealing device includes a sealing device main body and shims, the thickness of the shim or the number of shims is adjusted so that the combined height of the sealing device main body and the shims is within the allowable range. Note that, when the sealing device main body is attached to a certain component, this shim is placed between the sealing device main body and the certain component. Further, when the sealing device does not include shims, a new sealing device with a height within the allowable range is used. Furthermore, the sealing device 25 placed between the diaphragm inner ring 23 and the rotor shaft 16, described above with reference to FIG. 4, is attached to the diaphragm inner ring 23 side, which is a stationary body component. However, the sealing device may be attached to a rotor (rotating body) 15 m side. Further, for example, such as a labyrinth seal, a part of the sealing device may be attached to the rotor (rotating body) 15 m side, and the remaining part of the sealing device may be attached to the stationary body component side.

This completes the assembly of the steam turbine 10.

As described above, in the present embodiment, the fastened state shape data, which is the shape data for each of the plurality of casing components 38 in a state in which the plurality of casing components 38 are fastened to each other, is estimated in a simulated manner. Then, in the present embodiment, based on the fastened state shape data, the interval between the stationary body and the rotating body is calculated in the state in which the plurality of casing components 38 are fastened to each other and the plurality of stationary body components and the rotating body are assembled to each other. Thus, in the present embodiment, it is possible to omit the temporary assembly step for obtaining an interval between a stationary body and the rotating body in a state in which the plurality of casing components 38 are fastened to each other and the plurality of stationary body components and the rotating body are assembled to each other.

In the present embodiment, the corrected shape model 80a of the casing component 38 is used when estimating the fastened state shape data of the casing component 38. The corrected shape model 80a is a model in which the reference shape model 80 is corrected using the measured shape data and the self-weighted state shape data 89. The measured shape data is shape data based on the data obtained by actually measuring the shape of the target measurement part in the casing component 38. Further, the self-weighted state shape data 89 is data related to the shape when self-weight is applied to the casing component 38, which is obtained based on the reference shape model 80, in the same orientation as the orientation of the casing component 38 when the shape of the target measurement part is actually measured. Thus, in the present embodiment, it is possible to obtain the corrected shape model 80a that is closer to the shape of the actual casing component 38 than when creating a corrected shape model by simply correcting the reference shape data 58d using only the measured shape data.

Thus, in the present embodiment, by estimating the fastened state shape data using the corrected shape model 80a, the interval between the stationary body and the rotating body in the state in which the plurality of casing components 38 are fastened to each other and the plurality of stationary body components and the rotating body are assembled to each other can be calculated more accurately. Thus, in the present embodiment, by performing the adjustment step (S81) based on this interval, the relative position of the stationary body to the rotating body can be within the allowable range with high accuracy.

Modified Example

In the embodiments described above, only the flange surface 38s is used as the target measurement part. However, when the flange surface 38s and portions other than the flange surface 38s are used as the target measurement parts, and further, when only the shape of the flange surface 38s, which is the target measurement part, can be accurately measured in the measurement step (S21), the measured shape data creation step (S24) may be performed after the measurement step (S21) without performing the polygon data creation step (S22) and the data extraction step (S23).

Figure 20:
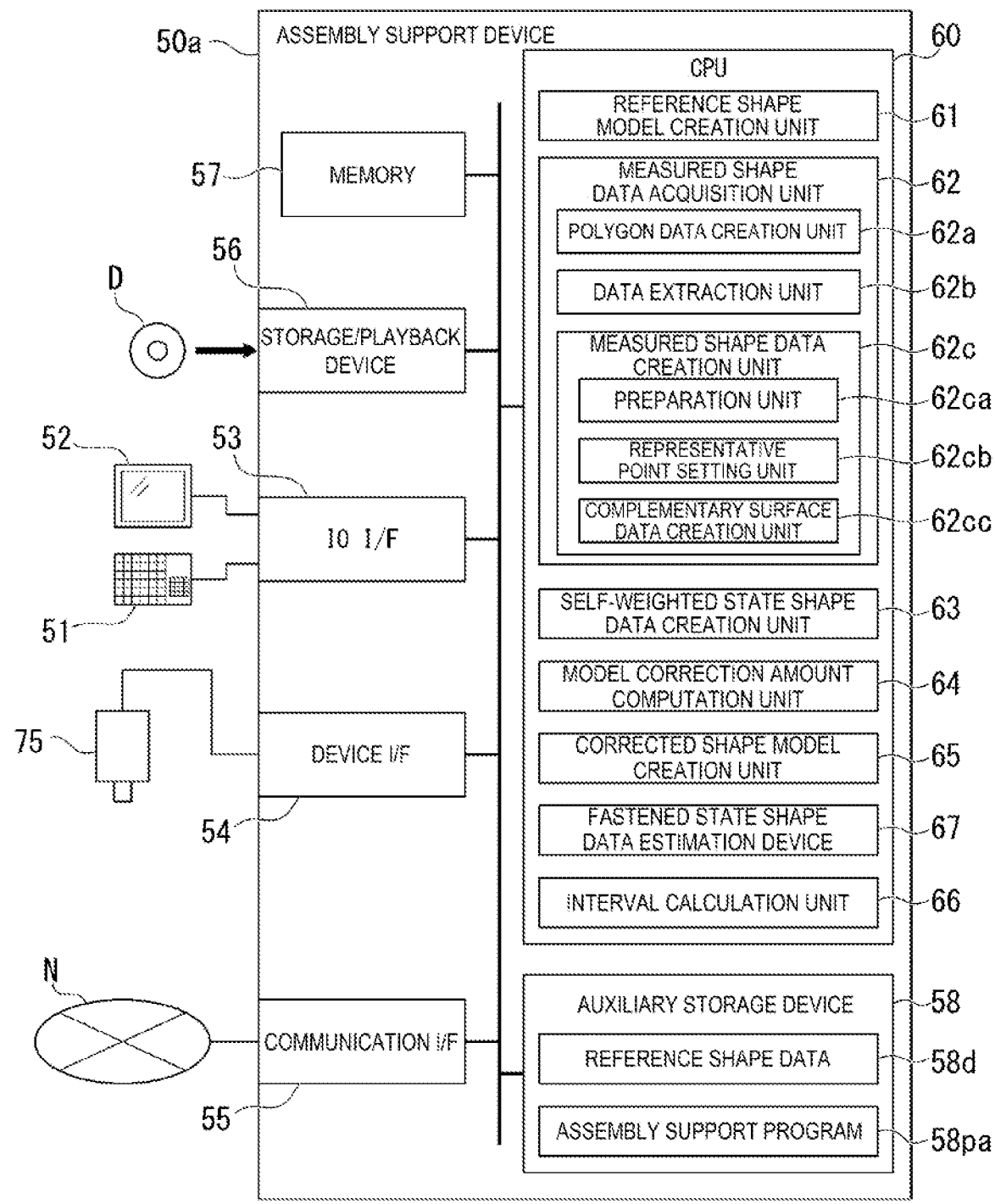
FIG. 20 is an explanatory diagram illustrating a configuration of an assembly support device in a modified example of the embodiment according to the present disclosure.

In the embodiments described above, as the devices for supporting the assembly of the turbine, the assembly support device 50 and the fastened state shape data estimation device 70 that estimates the fastened state shape data are provided. However, as illustrated in FIG. 20, an assembly support device 50*a* may include a fastened state shape data estimation unit 67 that estimates the fastened state shape data as a function thereof. In this case, an assembly support program 58*pa* to be executed by a computer that is an assembly support device 50*a* includes a step that causes the computer to estimate the fastened state shape data.

Supplementary Notes

The assembly method for a turbine according to the above embodiment can be understood, for example, as follows.

(1) An assembly method for a turbine according to a first aspect, in which the turbine 10 includes the rotating body 15 rotatable about an axis Ar and a stationary body including the casing 30 covering an outer periphery of the rotating body 15, in which the casing 30 includes a plurality of casing components 38 aligned in a circumferential direction Dc with respect to the axis Ar and a plurality of bolts 33, 37 configured to fasten the plurality of casing components 38 to each other, the assembly method for the turbine 10 includes a reference shape model creation step S10 of creating a reference shape model 80 for each of a plurality of stationary body components constituting the stationary body based on reference shape data 58*d* for each of the plurality of stationary body components obtained before the turbine 10 is shipped from a plant, a measured shape data acquisition step S20 of acquiring measured shape data for each of the plurality of casing components 38 by measuring a shape of a target measurement part that is predetermined for each of the plurality of casing components 38, in an open state in which the plurality of casing components 38 are not fastened to each other with the plurality of bolts 33, 37 after the turbine 10 is disassembled, a self-weighted state shape data creation step S30 of creating self-weighted state shape data 89 that is shape data when self-weight is applied to each of the plurality of casing components 38 by using the reference shape model 80 for each of the plurality of casing components 38, for each of the plurality of casing components 38, a model correction amount computation step S40 of computing a model correction amount of the reference shape model 80 from a difference between the measured shape data of the target measurement part and the self-weighted state shape data 89 of the target measurement part, for each of the plurality of casing components 38, a corrected shape model creation step S50 of creating a corrected shape model 80*a* by correcting the reference shape model 80 for each of the plurality of casing components 38 by using the model correction amount for each of the plurality of casing components 38, a fastened state shape data estimation step S60 of estimating, by using the corrected shape model 80*a*, fastened state shape data that is shape data for each of the plurality of casing components 38 in a state in which the plurality of casing components 38 are fastened to each other, an interval calculation step S70 of calculating, by using the fastened state shape data for each of the plurality of casing components 38, an interval of a predetermined portion among intervals between the stationary body and the rotating body 15 in a state in which the plurality of casing components 38 are fastened to each other and the plurality of stationary body components and the rotating body 15 are assembled to each other, and assembly steps S80 and S110 of assembling the plurality of stationary body components and the rotating body 15 to each other. The self-weighted state shape data 89 is shape data when self-weight is applied to the casing component 38 in the same orientation as an orientation of the casing component 38 when the shape of the target measurement part is actually measured. The assembly steps S80 and S110 include the adjustment steps S81 and S111, respectively, of adjusting the interval of the predetermined portion calculated in the interval calculation step S70 to be within a predetermined allowable range.

In the aspect, the fastened state shape data, which is the shape data for each of the plurality of casing components 38 in the state in which the plurality of casing components 38 are fastened to each other, is estimated in a simulated manner. Then, in the aspect, based on the fastened state shape data, the interval between the stationary body and the rotating body 15 is calculated in the state in which the plurality of casing components 38 are fastened to each other and the plurality of stationary body components and the rotating body 15 are assembled to each other. Thus, in the aspect, it is possible to omit the temporary assembly step for obtaining the interval between the stationary body and the rotating body 15 in the state in which the plurality of casing components 38 are fastened to each other and the plurality of stationary body components and the rotating body 15 are assembled to each other.

In the aspect, the corrected shape model 80*a* of the casing component 38 is used when estimating the fastened state shape data of the casing component 38. The corrected shape model 80*a* is a model in which the reference shape model 80 is corrected by using the measured shape data and the self-weighted state shape data 89. The measured shape data is shape data based on the data obtained by actually measuring the shape of the target measurement part in the casing component 38. Further, the self-weighted state shape data 89 is data related to the shape when self-weight is applied to the casing component 38, which is obtained based on the reference shape model 80, in the same orientation as the orientation of the casing component 38 when the shape of the target measurement part is actually measured. Thus, in the aspect, it is possible to obtain the corrected shape model 80*a* that is closer to the shape of the actual casing component 38 than when creating the corrected shape model 80*a* by simply correcting the reference shape data 58*d* by using only the measured shape data.

Thus, in the aspect, by estimating the fastened state shape data by using the corrected shape model 80*a*, the interval between the stationary body and the rotating body 15 in the state in which the plurality of casing components 38 are fastened to each other and the plurality of stationary body components and the rotating body 15 are assembled to each other can be calculated more accurately. Thus, in the aspect, by performing the adjustment steps S81 and S111 based on this interval, the relative position of the stationary body to the rotating body 15 can be within an allowable range with high accuracy.

(2) In the assembly method for a turbine according to a second aspect, in the assembly method for the turbine 10 according to the first aspect, each of the plurality of casing components 38 includes a main body extending in the circumferential direction Dc and a flange extending to the radial outer side Dro with respect to the axis Ar from an end of the main body in the circumferential direction Dc. The plurality of bolts 33, 37 are configured to fasten the respective flanges to each other for each of the plurality of casing components 38. The target measurement part for each of the plurality of casing components 38 is a flange surface 38s opposing the flange of an adjacent one of the casing components 38 in the circumferential direction Dc among the respective flanges of the plurality of casing components 38.

The deformation of each of the plurality of casing components 38 when shifting from a state in which the plurality of casing components 38 are fastened to each other to a state in which the plurality of casing components 38 are not fastened to each other is greatly affected by deformation of the flange surface 38s of each of the plurality of casing components 38. For this reason, in the aspect, in the measured shape data acquisition step S20, the region where the shape is actually measured in the casing component 38 is limited to the flange surface 38s. Thus, in the aspect, in the measured shape data acquisition step S20, the region where the shape is actually measured in the casing component 38 can be small, so that the time and effort taken to actually measure the shape of the casing component 38 can be reduced.

(3) In the assembly method for a turbine according to a third aspect, in the assembly method for the turbine 10 according to the second aspect, the measured shape data acquisition step S20 includes a measurement step S21 of measuring three-dimensional position data at a plurality of points 85 in a region including the target measurement part, for each of the plurality of casing components 38, a polygon data creation step S22 of creating a plurality of polygon data by using the three-dimensional position data at the plurality of points 85, for each of the plurality of casing components 38, a data extraction step S23 of extracting, from the plurality of polygon data, a plurality of polygon data in which an inclination of a polygon plane 86 identified by the plurality of polygon data with respect to the flange surface 38s is within a predetermined inclination, and a measured shape data creation step S24 of creating the measured shape data for each of the plurality of casing components 38 by using the plurality of polygon data extracted in the data extraction step S23.

In the aspect, among the three-dimensional position data at the plurality of points 85 measured in the measurement step S21, the three-dimensional position data at the point 85 on the flange surface 38s can be efficiently extracted.

(4) In the assembly method for a turbine according to a fourth aspect, in the assembly method for the turbine 10 according to the third aspect, the creating measured shape data step S24 includes a preparation step S24a of dividing a virtual three-dimensional space including the target measurement part into a plurality of three-dimensional blocks 83 for each of the plurality of casing components 38, a representative point setting step S24b of setting a representative point 87 in a target three-dimensional block 83 for each of the plurality of three-dimensional blocks 83, and a complementary surface data creation step S24c of creating data of a complementary surface 88 including the representative point 87 for each of the plurality of three-dimensional blocks 83 by connecting the respective representative points 87 of the plurality of three-dimensional blocks 83 with each other with a plane or a curved surface as the complementary surface 88. In the representative point setting step S24b, among the plurality of points 85 included in the polygon plane 86 identified by the plurality of polygon data extracted in the data extraction step S23, a point 85 that is a median of the three-dimensional position data for each of the plurality of points 85 included in the target three-dimensional block 83 is set as the representative point 87 in the target three-dimensional block 83. In the model correction amount computation step S40, the data of the complementary surface 88 is used as the measured shape data of the target measurement part for each of the plurality of casing components 38.

The three-dimensional position data related to the point 85 obtained by the three-dimensional shape measuring device 75 contains an error. For example, when the three-dimensional shape measuring device 75 is a three-dimensional laser measuring device, the three-dimensional position data measured by the three-dimensional laser measuring device will contain the error when there is a minute floating object between the measurement target and the three-dimensional laser measuring device. Thus, in the aspect, the error range of the three-dimensional position data related to the points 85 obtained by the three-dimensional shape measuring device 75 can be narrowed by setting the point 85 that is the median of the three-dimensional position data of the plurality of points 85 included in the three-dimensional block 83 as the representative point 87 in the three-dimensional block 83.

In addition, in the aspect, the respective representative points 87 for each of the plurality of three-dimensional blocks 83 are connected to each other with the plane or the curved surface as the complementary surface 88 to create the data of the complementary surface 88 including the representative point 87 for each of the plurality of three-dimensional blocks 83. Then, the data of the complementary surface 88 is set as the measured shape data. Thus, in the aspect, it is possible to obtain measured shape data that is continuous over the entire flange surface 81 on the reference shape model 80 and has a narrow error range.

(5) In the assembly method for a turbine according to a fifth aspect, in the assembly method for the turbine 10 according to any one of the second to the fourth aspects, the target measurement part for each of the plurality of casing components 38 is only the flange surface 38s.

In the aspect, since the target measurement part is only the flange surface 38s, in the measured shape data acquisition step S20, the region where the shape is actually measured in the casing component 38 can be small, so that the time and effort taken to actually measure the shape of the casing component 38 can be reduced.

(6) In the assembly method for a turbine according to a sixth aspect, in the assembly method according to the first aspect, the measured shape data acquisition step S20 includes a measurement step S21 of measuring three-dimensional position data at a plurality of points 85 in a region including the target measurement part, for each of the plurality of casing components 38, a preparation step S24a of dividing a virtual three-dimensional space including the target measurement part into a plurality of three-dimensional blocks 83 for each of the plurality of casing components 38, a representative point setting step S24b setting a representative point 87 in a target three-dimensional block 83 for each of the plurality of three-dimensional blocks 83, and a complementary surface data creation step S24c of creating data of a complementary surface 88 including the representative point 87 for each of the plurality of three-dimensional blocks 83 by connecting the respective representative points 87 for each of the plurality of three-dimensional blocks 83 with each other with a plane or a curved surface as the complementary surface 88. In the representative point setting step S24b, among the plurality of points 85 measured in the measurement step S21, a point 85 that is a median of the three-dimensional position data for each of the plurality of points 85 included in the target three-dimensional block 83 is set as the representative point 87 in the target three-dimensional block 83. In the model correction amount computation step S40, the data of the complementary surface 88 is used as the measured shape data of the target measurement part for each of the plurality of casing components 38.

In the aspect, the error range of the three-dimensional position data related to the points 85 obtained by the three-dimensional shape measuring device 75 can be narrowed by setting the point 85 that is the median of the three-dimensional position data of the plurality of points 85 included in the three-dimensional block 83 as the representative point 87 in the three-dimensional block 83. In addition, in the aspect, the respective representative points 87 for each of the plurality of three-dimensional blocks 83 are connected to each other with the plane or the curved surface to create the data of the complementary surface 88 including the representative point 87 for each of the plurality of three-dimensional blocks 83. Then, the data of the complementary surface 88 is set as the measured shape data. Thus, in the aspect, it is possible to obtain the measured shape data that is continuous over the entire target measurement part and has a narrow error range.

(7) In the assembly method for a turbine according to a seventh aspect, in the assembly method for the turbine 10 according to any one of the first to the sixth aspects, the reference shape data 58*d* for each of the plurality of stationary body components constituting the stationary body obtained before shipping the turbine 10 is one of design data for each of the plurality of stationary body components constituting the stationary body or measured data obtained by actually measuring each of the plurality of stationary body components constituting the stationary body.

The assembly support program for a turbine according to the embodiment can be understood, for example, as follows.

(8) An assembly support program for a turbine according to the eighth aspect, in which the turbine 10 includes the rotating body 15 rotatable about an axis Ar and a stationary body including the casing 30 covering an outer periphery of the rotating body 15, in which the casing 30 includes a plurality of casing components 38 aligned in a circumferential direction Dc with respect to the axis Ar and the plurality of bolts 33, 37 configured to fasten the plurality of casing components 38 to each other, a program 58*p*, 58*pa* causes a computer to execute a reference shape model creation step S10 of creating a reference shape model 80 for each of a plurality of stationary body components constituting the stationary body based on reference shape data 58*d* for each of the plurality of stationary body components obtained before the turbine 10 is shipped from a plant, a measured shape data acquisition step S20 of acquiring measured shape data for each of the plurality of casing components 38 based on a result of measuring a shape of a target measurement part that is predetermined for each of the plurality of casing components 38, in an open state in which the plurality of casing components 38 are not fastened to each other with the plurality of bolts 33, 37 after the turbine 10 is disassembled, a self-weighted state shape data creation step S30 of creating self-weighted state shape data 89 that is shape data when self-weight is applied to each of the plurality of casing components 38 by using the reference shape model 80 for each of the plurality of casing components 38, for each of the plurality of casing components 38, a model correction amount computation step S40 of computing a model correction amount of the reference shape model 80 from a difference between the measured shape data of the target measurement part and the self-weighted state shape data 89 of the target measurement part, for each of the plurality of casing components 38, a corrected shape model creation step S50 of creating a corrected shape model 80*a* by correcting the reference shape model 80 for each of the plurality of casing components 38 by using the model correction amount for each of the plurality of casing components 38, and an interval calculation step S70 of calculating, by using fastened state shape data for each of the plurality of casing components 38, an interval of a predetermined portion among intervals between the stationary body and the rotating body 15 in a state in which the plurality of casing components 38 are fastened to each other and the plurality of stationary body components and the rotating body 15 are assembled to each other. The self-weighted state shape data 89 is shape data when self-weight is applied to the casing component 38 in the same orientation as an orientation of the casing component 38 when the shape of the target measurement part is actually measured. The fastened state shape data for each of the plurality of casing components 38 is shape data estimated, by using the corrected shape model 80*a*, for each of the plurality of casing components 38 in a state in which the plurality of casing components 38 are fastened to each other.

By executing the assembly support program 58*p*, 58*pa* according to the aspect, similar to the assembly method for the turbine 10 according to the first aspect, it is possible to omit the temporary assembly steps S80 for obtaining the interval between the stationary body and the rotating body 15 in the state in which the plurality of casing components 38 are fastened to each other and the plurality of stationary body components and the rotating body 15 are assembled to each other. Further, by executing the assembly support program 58*p*, 58*pa* of the aspect, similar to the assembly method for the turbine 10 according to the first aspect, the interval between the stationary body and the rotating body 15 in the state in which the plurality of casing components 38 are fastened to each other and the plurality of stationary body components and the rotating body 15 are assembled to each other can be obtained more accurately.

(9) In the assembly support program for a turbine according to the ninth aspect, in the assembly support program 58*p*, 58*pa* of the turbine 10 according to the eighth aspect, each of the plurality of casing components 38 includes a main body extending in the circumferential direction Dc and a flange extending to the radial outer side Dro with respect to the axis Ar from an end of the main body in the circumferential direction Dc. The plurality of bolts 33, 37 are configured to fasten the respective flanges to each other for each of the plurality of casing components 38. The target measurement part for each of the plurality of casing components 38 is a flange surface 38*s* opposing the flange of an adjacent one of the casing components 38 in the circumferential direction Dc among the respective flanges of the plurality of casing components 38.

In the aspect, similar to the assembly method for the turbine 10 according to the second aspect, the time and effort taken to actually measure the shape of the casing component 38 can be reduced.

(10) In the assembly support program for a turbine according to a tenth aspect, in the assembly support program 58*p*, 58*pa* of the turbine 10 according to the ninth aspect, the measured shape data acquisition step S20 includes a polygon data creation step S22 of creating a plurality of polygon data by using the three-dimensional position data at a plurality of points 85, for each of the plurality of casing components 38, after acquiring three-dimensional position data measured at the plurality of points 85 in a region including the target measurement part, for each of the plurality of casing components 38, a data extraction step S23 of extracting, from the plurality of polygon data, a plurality of polygon data in which an inclination of a polygon plane 86 identified by the plurality of polygon data with respect to the flange surface 38s is within a predetermined inclination, and a measured shape data creation step S24 of creating the measured shape data for each of the plurality of casing components 38 by using the plurality of polygon data extracted in the data extraction step S23.

By executing the assembly support program 58p, 58pa according to the aspect, similar to the assembly method for the turbine 10 according to the third aspect, among the three-dimensional position data measured at the plurality of points 85 in the region including the target measurement part, the three-dimensional position data at the point 85 on the flange surface 38s can be efficiently extracted.

(11) In the assembly support program for a turbine according to an eleventh aspect, in the assembly support program 58p, 58pa of the turbine 10 according to the 10th aspect, the measured shape data creation step S24 includes a preparation step S24a of dividing a virtual three-dimensional space including the target measurement part into a plurality of three-dimensional blocks 83 for each of the plurality of casing components 38, a representative point setting step S24b of setting a representative point 87 in a target three-dimensional block 83 for each of the plurality of three-dimensional blocks 83, and a complementary surface data creation step S24c of creating data of the complementary surface 88 including the representative point 87 for each of the plurality of three-dimensional blocks 83 by connecting the respective representative points 87 for each of the plurality of three-dimensional blocks 83 with each other with a plane or a curved surface as the complementary surface 88. In the representative point setting step S24b, among the plurality of points 85 included in the polygon plane 86 identified by the plurality of polygon data extracted in the data extraction step S23, a point 85 that is a median of the three-dimensional position data for each of the plurality of points 85 included in the target three-dimensional block 83 is set as the representative point 87 in the target three-dimensional block 83. In the model correction amount computation step S40, the data of the complementary surface 88 is used as the measured shape data of the target measurement part for each of the plurality of casing components 38.

By executing the assembly support program 58p, 58pa according to the aspect, similar to the assembly method for the turbine 10 according to the fourth aspect, it is possible to obtain measured shape data that is continuous over the entire flange surface 38s in the reference shape model 80 and has a narrow error range.

(12) In the assembly support program for a turbine according to a twelfth aspect, in the assembly support program 58p, 58pa of the turbine 10 according to any one of the ninth to the 11th aspects, the target measurement part for each of the plurality of casing components 38 is only the flange surface 38s.

In the aspect, similar to the assembly method for the turbine 10 according to the fifth aspect, the time and effort taken to actually measure the shape of the casing component 38 can be reduced.

(13) In the assembly support program for a turbine according to a 13th aspect, in the assembly support program 58p, 58pa of the turbine 10 according to the eighth aspect, the measured shape data acquisition step S20 includes a preparation step S24a of dividing a virtual three-dimensional space including the target measurement part into a plurality of three-dimensional blocks 83 for each of the plurality of casing components 38, a representative point setting step S24b of setting a representative point 87 in a target three-dimensional block 83 for each of the plurality of three-dimensional blocks 83, and a complementary surface data creation step S24c of creating data of a complementary surface 88 including the representative point 87 for each of the plurality of three-dimensional blocks 83 by connecting the respective representative points 87 for each of the plurality of three-dimensional blocks 83 with each other with a plane or a curved surface as the complementary surface 88. In the representative point setting step S24b, three-dimensional position data measured at the plurality of points 85 in a region including the target measurement part is acquired for each of the plurality of casing components 38, and among the plurality of points 85 for each of the plurality of casing components 38, the point 85 that is a median of the three-dimensional position data for each of the plurality of points 85 included in the target three-dimensional block 83 is set as the representative point 87 in the target three-dimensional block 83. In the model correction amount computation step S40, the data of the complementary surface 88 is used as the measured shape data of the target measurement part for each of the plurality of casing components 38.

By executing the assembly support program 58p, 58pa according to the aspect, similar to the assembly method for the turbine 10 according to the sixth aspect, it is possible to obtain measured shape data that is continuous over the entire target measurement part and has a narrow error range.

(14) In the assembly support program for a turbine according to a fourteenth aspect, in the assembly support program 58pa of the turbine 10 according to any one of the eighth to 13th aspects, the program further causes the computer to execute a fastened state shape data estimation step S60 of estimating, by using the corrected shape model 80a, the fastened state shape data for each of the plurality of casing components 38 in a state in which the plurality of casing components 38 are fastened to each other.

The assembly support device for a turbine according to the embodiment can be understood, for example, as follows.

(15) An assembly support device for a turbine according to a fifteenth aspect, in which the turbine 10 includes the rotating body 15 rotatable about an axis Ar and a stationary body including the casing 30 covering an outer periphery of the rotating body 15, in which the casing 30 includes a plurality of casing components 38 aligned in a circumferential direction Dc with respect to the axis Ar and the plurality of bolts 33, 37 configured to fasten the plurality of casing components 38 to each other, an assembly support device 50, 50a includes a reference shape model creation unit 61 configured to create a reference shape model 80 for each of a plurality of stationary body components constituting the stationary body based on reference shape data 58d for each of the plurality of stationary body components obtained before the turbine 10 is shipped from a plant, a measured shape data acquisition unit 62 configured to acquire measured shape data for each of the plurality of casing components 38 based on a result of measuring a shape of a target measurement part that is predetermined for each of the plurality of casing components 38, in an open state in which the plurality of casing components 38 are not fastened to each other with the plurality of bolts 33, 37 after the turbine 10 is disassembled, a self-weighted state shape data creation unit 63 configured to create self-weighted state shape data 89 that is shape data when self-weight is applied to each of the plurality of casing components 38 by using the reference shape model 80 for each of the plurality of casing components 38, for each of the plurality of casing components 38, a model correction amount computation unit 64 configured to compute a model correction amount of the reference shape model 80 from a difference between the measured shape data of the target measurement part and the self-weighted state shape data 89 of the target measurement part, for each of the plurality of casing components 38, a corrected shape model creation unit 65 configured to create a corrected shape model 80*a* by correcting the reference shape model 80 for each of the plurality of casing components 38 by using the model correction amount for each of the plurality of casing components 38, and an interval calculation unit 66 configured to calculate, by using fastened state shape data for each of the plurality of casing components 38, an interval of a predetermined portion among intervals between the stationary body and the rotating body 15 in a state in which the plurality of casing components 38 are fastened to each other and the plurality of stationary body components and the rotating body 15 are assembled to each other. The self-weighted state shape data 89 is shape data when self-weight is applied to the casing component 38 in the same orientation as an orientation of the casing component 38 when the shape of the target measurement part is actually measured. The fastened state shape data for each of the plurality of casing components 38 is shape data estimated, by using the corrected shape model 80*a*, for each of the plurality of casing components 38 in a state in which the plurality of casing components 38 are fastened to each other.

By operating the assembly support device 50, 50*a* according to the aspect, similar to the assembly method for the turbine 10 according to the first aspect, it is possible to omit the temporary assembly steps S80 and S110 for obtaining the interval between the stationary body and the rotating body 15 in the state in which the plurality of casing components 38 are fastened to each other and the plurality of stationary body components and the rotating body 15 are assembled to each other. Further, by operating the assembly support device 50, 50*a* of the aspect, similar to the assembly method for the turbine 10 according to the first aspect, the interval between the stationary body and the rotating body 15 in the state in which the plurality of casing components 38 are fastened to each other and the plurality of stationary body components and the rotating body 15 are assembled to each other can be obtained more accurately.

(16) In the assembly support device for a turbine according to a sixteenth aspect, in the assembly support device 50, 50*a* of the turbine 10 according to the 15th aspect, each of the plurality of casing components 38 includes a main body extending in the circumferential direction Dc and a flange extending to the radial outer side Dro with respect to the axis Ar from an end of the main body in the circumferential direction Dc. The plurality of bolts 33, 37 are configured to fasten the respective flanges to each other for each of the plurality of casing components 38. The target measurement part for each of the plurality of casing components 38 is a flange surface 38*s* opposing the flange of an adjacent one of the casing components 38 in the circumferential direction Dc among the respective flanges of the plurality of casing components 38.

In the aspect, similar to the assembly method for the turbine 10 according to the second aspect, the time and effort taken to actually measure the shape of the casing component 38 can be reduced.

(17) In the assembly support device for a turbine according to a seventeenth aspect, in the assembly support device 50, 50*a* of the turbine 10 according to the 16th aspect, the measured shape data acquisition unit 62 includes a polygon data creation unit 62*a* configured to create a plurality of polygon data by using the three-dimensional position data at the plurality of points 85, for each of the plurality of casing components 38, after acquiring three-dimensional position data measured at the plurality of points 85 in a region including the target measurement part, for each of the plurality of casing components 38, a data extraction unit 62*b* configured to extract, from the plurality of polygon data, a plurality of polygon data in which an inclination of the polygon plane 86 identified by the plurality of polygon data with respect to the flange surface 38*s* is within a predetermined inclination, and a measured shape data creation unit 62*c* configured to create the measured shape data for each of the plurality of casing components 38 by using the plurality of polygon data extracted in the data extraction unit 62*b*.

By operating the assembly support device 50, 50*a* according to the aspect, similar to the assembly method for the turbine 10 according to the third aspect, among the three-dimensional position data measured at the plurality of points 85 in the region including the target measurement part, the three-dimensional position data at the point 85 on the flange surface 38*s* can be efficiently extracted.

(18) In the assembly support device for a turbine according to a eighteenth aspect, in the assembly support device 50, 50*a* of the turbine 10 according to the 17th aspect, the measured shape data creation unit 62*c* includes a preparation unit 62*ca* configured to divide a virtual three-dimensional space including the target measurement part into the plurality of three-dimensional blocks 83 for each of the plurality of casing components 38, the representative point setting unit 62*cb* configured to set the representative point 87 in the target three-dimensional block 83 for each of the plurality of three-dimensional blocks 83, and a complementary surface data creation unit 62*cc* configured to create data of the complementary surface 88 including the representative point 87 for each of the plurality of three-dimensional blocks 83 by connecting the respective representative points 87 for each of the plurality of three-dimensional blocks 83 with each other with a plane or a curved surface as the complementary surface 88. The representative point setting unit 62*cb* sets, among the plurality of points 85 included in the polygon plane 86 identified by the plurality of polygon data extracted by the data extraction unit 62*b*, a point 85 that is a median of the three-dimensional position data for each of the plurality of points 85 included in the target three-dimensional block 83 as the representative point 87 in the target three-dimensional block 83. The model correction amount computation unit 64 uses the data of the complementary surface 88 as the measured shape data of the target measurement part for each of the plurality of casing components 38.

By operating the assembly support device 50, 50*a* according to the aspect, similar to the assembly method for the turbine 10 according to the fourth aspect, it is possible to obtain the measured shape data that is continuous over the entire flange surface 38*s* in the reference shape model 80 and has a narrow error range.

(19) In the assembly support device for a turbine according to a nineteenth aspect, in the assembly support device 50, 50*a* of the turbine 10 according to any one of the sixteenth to the eighteenth aspects, the target measurement part for each of the plurality of casing components 38 is only the flange surface 38*s*.

In the aspect, similar to the assembly method for the turbine 10 according to the fifth aspect, the time and effort taken to actually measure the shape of the casing component 38 can be reduced.

(20) In the assembly support device for a turbine according to a twenty aspect, in the assembly support device 50, 50a of the turbine 10 according to the 15th aspect, the measured shape data acquisition unit 62 includes a preparation unit 62ca configured to divide a virtual three-dimensional space including the target measurement part into the plurality of three-dimensional blocks 83 for each of the plurality of casing components 38, a representative point setting unit 62cb configured to set a representative point 87 in the target three-dimensional block 83 for each of the plurality of three-dimensional blocks 83, and a complementary surface data creation unit 62cc configured to create data of the complementary surface 88 including the representative point 87 for each of the plurality of three-dimensional blocks 83 by connecting the respective representative points 87 for each of the plurality of three-dimensional blocks 83 with each other with a plane or a curved surface as the complementary surface 88. The representative point setting unit 62cb acquires the three-dimensional position data measured at the plurality of points 85 in a region including the target measurement part for each of the plurality of casing components 38, and sets, among the plurality of points 85 for each of the plurality of casing components 38, a point 85 that is a median of the three-dimensional position data for each of the plurality of points 85 included in the target three-dimensional block 83 as the representative point 87 in the target three-dimensional block 83. The model correction amount computation unit 64 uses the data of the complementary surface 88 as the measured shape data of the target measurement part for each of the plurality of casing components 38.

By operating the assembly support device 50, 50a according to the aspect, similar to the assembly method for the turbine 10 according to the sixth aspect, it is possible to obtain the measured shape data that is continuous over the entire target measurement part and has a narrow error range.

(21) The assembly support device for the turbine according to the twenty-first aspect further includes, in the assembly support device 50a of the turbine 10 according to any one of the 15th to the twentieth aspects, the fastened state shape data estimation unit 67 configured to estimate, by using the corrected shape model 80a, the fastened state shape data for each of the plurality of casing components 38 in a state in which the plurality of casing components 38 are fastened to each other.

INDUSTRIAL APPLICABILITY

According to the present disclosure, the relative position of a stationary body to a rotating body can be within an allowable range with high accuracy.

REFERENCE SIGNS LIST

10: Steam turbine (turbine)
11: Frame
12: Bearing
15: Rotor (rotating body)
16: Rotor shaft
17: Rotor blade row
20: Diaphragm
21a: Lower half diaphragm (stationary body component)
21b: Upper half diaphragm (stationary body component)
22: Stator vane
23: Diaphragm inner ring
24: Diaphragm outer ring
25: Sealing device
30: Casing
31: Outer casing
32a: Lower half outer casing (casing component or stationary body component)
32ab: Outer casing main body
32af: Outer casing flange
32as: Flange surface (target measurement part)
32ag: Support groove
32b: Upper half outer casing (casing component or stationary body component)
32bb: Outer casing main body
32bf: Outer casing flange
32bs: Flange surface (target measurement part)
33: Bolt
35: Inner casing
36a: Lower half inner casing (casing component or stationary body component)
36ab: Inner casing main body
36af: Inner casing flange
36as: Flange surface (target measurement part)
36ag: Support-receiving part
36b: Upper half inner casing (casing component or stationary body component)
36bb: Inner casing main body
36bf: Inner casing flange
36bs: Flange surface (target measurement part)
37: Bolt
38: Casing component
38s: Flange surface (target measurement part)
39: Shim
50, 50a: Assembly support device
51: Manual input device
52: Display device
53: Input/output interface
54: Device interface
55: Communication interface
56: Storage/playback device
57: Memory
58: Auxiliary storage device
58d: Reference shape data
58p, 58pa: Assembly support program
60: CPU
61: Reference shape model creation unit
62: Measured shape data acquisition unit
62a: Polygon data creation unit
62b: Data extraction unit
62c: Measured shape data creation unit
62ca: Preparation unit
62cb: Representative point setting unit
62cc: Complementary surface data creation unit
63: Self-weighted state shape data creation unit
64: Model correction amount computation unit
65: Corrected shape model creation unit
66: Interval calculation unit
67: Fastened state shape data estimation unit
70: Fastened state shape data estimation device
75: Three-dimensional shape measuring device
80: Reference shape model
80a: Corrected shape model
81: Flange surface in reference shape model (target measurement part)
82: Surface inclined to flange surface in reference shape model 83: Three-dimensional block
84: Grid
85: Point
86, 86a, 86b: Polygon (polygon plane)
87: Representative point 88: Complementary surface
89: Self-weighted state shape data
Ar: Axis
Da: Axial direction
Dc: Circumferential direction
Dr: Radial direction
Dri: Radial inner side
Dro: Radial outer side

The invention claimed is:

1. An assembly method for a turbine, the turbine including a rotating body rotatable about an axis and a stationary body including a casing covering an outer periphery of the rotating body, in which the casing includes a plurality of casing components aligned in a circumferential direction with respect to the axis and a plurality of bolts configured to fasten the plurality of casing components to each other, the assembly method comprising:
creating a reference shape model for each of a plurality of stationary body components constituting the stationary body based on reference shape data for each of the plurality of stationary body components obtained before the turbine is shipped from a plant;
acquiring measured shape data for each of the plurality of casing components by measuring a shape of a target measurement part that is predetermined for each of the plurality of casing components, in an open state in which the plurality of casing components are not fastened to each other with the plurality of bolts after the turbine is disassembled;
creating self-weighted state shape data that is shape data when self-weight is applied to each of the plurality of casing components by using the reference shape model for each of the plurality of casing components, for each of the plurality of casing components;
computing a model correction amount of the reference shape model from a difference between the measured shape data of the target measurement part and the self-weighted state shape data of the target measurement part, for each of the plurality of casing components;
creating a corrected shape model by correcting the reference shape model for each of the plurality of casing components by using the model correction amount for each of the plurality of casing components;
estimating, by using the corrected shape model, fastened state shape data that is shape data for each of the plurality of casing components in a state in which the plurality of casing components are fastened to each other;
calculating, by using the fastened state shape data for each of the plurality of casing components, an interval of a predetermined portion among intervals between the stationary body and the rotating body in a state in which the plurality of casing components are fastened to each other and the plurality of stationary body components and the rotating body are assembled to each other; and
assembling the plurality of stationary body components and the rotating body to each other, wherein
the self-weighted state shape data is shape data when self-weight is applied to the casing component in the same orientation as an orientation of the casing component when the shape of the target measurement part is actually measured, and
the assembling includes adjusting the interval of the predetermined portion calculated in the calculating an interval to be within a predetermined allowable range.

2. The assembly method for a turbine according to claim 1, wherein
each of the plurality of casing components includes a main body extending in the circumferential direction and a flange extending outward in a radial direction with respect to the axis from an end of the main body in the circumferential direction,
the plurality of bolts are configured to fasten the respective flanges to each other for each of the plurality of casing components, and
the target measurement part for each of the plurality of casing components is a flange surface opposing a flange of an adjacent one of the casing components in the circumferential direction among the respective flanges of the plurality of casing components.

3. The assembly method for a turbine according to claim 2, wherein
the acquiring measured shape data includes
measuring three-dimensional position data at a plurality of points in a region including the target measurement part, for each of the plurality of casing components,
creating a plurality of polygon data by using the three-dimensional position data at the plurality of points, for each of the plurality of casing components,
extracting, from the plurality of polygon data, a plurality of polygon data in which an inclination of a polygon plane identified by the plurality of polygon data with respect to the flange surface is within a predetermined inclination, and
creating the measured shape data for each of the plurality of casing components by using the plurality of polygon data extracted in the extracting a plurality of polygon data.

4. The assembly method for a turbine according to claim 3, wherein
the creating the measured shape data includes
dividing a virtual three-dimensional space including the target measurement part into a plurality of three-dimensional blocks for each of the plurality of casing components,
setting a representative point in a target three-dimensional block for each of the plurality of three-dimensional blocks, and
creating data of a complementary surface including the representative point for each of the plurality of three-dimensional blocks by connecting the respective representative points for each of the plurality of three-dimensional blocks with each other with a plane or a curved surface as the complementary surface,
in the setting a representative point, among the plurality of points included in the polygon plane identified by the plurality of polygon data extracted in the extracting data, a point that is a median of the three-dimensional position data for each of the plurality of points included in the target three-dimensional block is set as the representative point in the target three-dimensional block, and
in the computing a model correction amount, the data of the complementary surface is used as the measured shape data of the target measurement part for each of the plurality of casing components.

5. The assembly method for a turbine according to claim 2, wherein the target measurement part for each of the plurality of casing components is only the flange surface.

6. The assembly method for a turbine according to claim 1, wherein the acquiring measured shape data includes measuring three-dimensional position data at a plurality of points in a region including the target measurement part, for each of the plurality of casing components, dividing a virtual three-dimensional space including the target measurement part into a plurality of three-dimensional blocks for each of the plurality of casing components, setting a representative point in a target three-dimensional block for each of the plurality of three-dimensional blocks, and creating data of a complementary surface including the representative point for each of the plurality of three-dimensional blocks by connecting the respective representative points for each of the plurality of three-dimensional blocks with each other with a plane or a curved surface as the complementary surface, in the setting a representative point, among the plurality of points measured in the measuring, a point that is a median of the three-dimensional position data for each of the plurality of points included in the target three-dimensional block is set as the representative point in the target three-dimensional block, and in the computing a model correction amount, the data of the complementary surface is used as the measured shape data of the target measurement part for each of the plurality of casing components.

7. The assembly method for a turbine according to claim 1, wherein the reference shape data for each of the plurality of stationary body components constituting the stationary body obtained before shipping the turbine is one of design data for each of the plurality of stationary body components constituting the stationary body or measured data obtained by actually measurement for each of the plurality of stationary body components constituting the stationary body.

* * * * *